(12) United States Patent
Wu et al.

(10) Patent No.: US 10,903,267 B2
(45) Date of Patent: Jan. 26, 2021

(54) SYSTEM AND METHOD FOR MAKING MICRO LED DISPLAY

(71) Applicants: Bor-Jen Wu, New Taipei (TW); Chia-Bin Tsen, New Taipei (TW)

(72) Inventors: Bor-Jen Wu, New Taipei (TW); Chia-Bin Tsen, New Taipei (TW)

(*) Notice: Subject to any disclaimer, the term of this patent is extended or adjusted under 35 U.S.C. 154(b) by 98 days.

(21) Appl. No.: 16/375,388

(22) Filed: Apr. 4, 2019

(65) Prior Publication Data

US 2020/0321390 A1 Oct. 8, 2020

(51) Int. Cl.
| | | |
|---|---|---|
| *H01L 27/15* | (2006.01) | |
| *H01L 33/00* | (2010.01) | |
| *H01L 33/32* | (2010.01) | |
| *H01L 33/62* | (2010.01) | |
| *H01L 33/50* | (2010.01) | |
| *H01L 33/44* | (2010.01) | |

(52) U.S. Cl.
CPC .......... *H01L 27/156* (2013.01); *H01L 33/007* (2013.01); *H01L 33/32* (2013.01); *H01L 33/44* (2013.01); *H01L 33/50* (2013.01); *H01L 33/62* (2013.01); *H01L 2933/0025* (2013.01); *H01L 2933/0041* (2013.01); *H01L 2933/0066* (2013.01)

(58) Field of Classification Search
CPC ..... H01L 27/156; H01L 33/007; H01L 33/32; H01L 33/44; H01L 33/50; H01L 33/62
See application file for complete search history.

(56) References Cited

U.S. PATENT DOCUMENTS

| | | | |
|---|---|---|---|
| 7,825,006 B2 | 11/2010 | Nakamura et al. | |
| 8,794,501 B2 | 8/2014 | Bibl et al. | |
| 2015/0301402 A1* | 10/2015 | Kimura | G02F 1/1336 349/69 |
| 2017/0148771 A1* | 5/2017 | Cha | H05K 3/325 |
| 2018/0166429 A1* | 6/2018 | Chong | H01L 21/6835 |
| 2018/0226287 A1* | 8/2018 | Bower | B65G 47/91 |

\* cited by examiner

*Primary Examiner* — Christine A Enad
(74) *Attorney, Agent, or Firm* — WPAT, PC

(57) ABSTRACT

By using chip-by-chip, mainly separation technology, micro LED can be made very accurately and efficiently. First, after epitaxial process, the LED epi-wafer is processed into micro LEDs. Second, bonding substrates with driving circuits are provided for the LED epi-wafer. Then, each LED chip is fastened to the substrate chip-by-chip simultaneously or sequentially, and each LED chip may be transferred by using separation technology simultaneously or sequentially. The LED epi-wafer per se can be also provided as LED display substrate.

18 Claims, 19 Drawing Sheets

SYSTEM AND METHOD FOR MAKING MICRO LED DISPLAY

FIELD OF THE INVENTION

The invention relates to a micro LED display panel and a method for forming the micro LED display panel. The invention also relates to an apparatus for forming the micro LED panel. However, it would be recognized that the invention has a much broader range of applicability.

BACKGROUND OF THE INVENTION

Micro LED, followed conventional TFT LCD display and OLED display, is deemed as a next high technologic display. Advantages of micro LED, inherited from conventional LED, include low power consumption, high brightness, short response time, and long life time. The 55 inch crystal LED TV, assembled by micro LED, is announced and manufactured by Sony in 2012, in which more than six million micro LEDs were used as high resolution pixels with million levels contrast, more than 140% NTSC, no response time issue compared to LCD display, as well as no life issue compared to OLED display. Technologies of micro LED display are to shrink LED chip dimension down to 1% of conventional LED chip, to adapt single micro LED in high resolution display, to shrink pitch between two micro LEDs from mini meter into micro meter scale, to address each pixel individually, and to drive each individual micro LED of a micro LED array.

However, for each single micro LED, conventional manufacturing process can't be adapted in mass production due to millions of micro LEDs in one display are hard to be transferred from substrate to display efficiently; that's the mass transfer issue.

To solve this issue, several approaches have been proposed. A US patent, patent number U.S. Pat. No. 8,794,501, by Andreas Bibl et al, recites that all micro LED on an epi-substrate is completely transferred to a temporal or bonding substrate at once, and then each single micro LED is picked up individually from the bonding substrate to the receiving substrate of a display panel by using phase transition. The mass transfer issue still exists that millions of micro LED have to be picked up from bonding substrate to receiving substrate individually; that's too time consuming. Some other solutions, such as by using fluid filter or drop by gravity force, are still not industrially available.

Accordingly, it is necessary to provide an industrially and commercially viable solution in the mass transfer issue for the micro LED manufacture.

BRIEF SUMMARY OF THE INVENTION

The object of this invention is to provide a commercially and industrially viable solution for micro LED display manufacturing method, a micro LED display, and apparatus for manufacturing micro LED display.

Accordingly, the invention therefore provides a method for forming a display panel, which comprises steps of providing a first substrate with a first plurality of light emitting diode chips thereon, for each first light emitting diode chip of the first plurality of light emitting diode chips, a paired Ohmic electrodes being formed on each of the first light emitting diode chip, wherein the each light emitting diode emits light with a first wavelength; providing a second substrate with driving circuits thereon for the display panel and a plurality of paired bonding pads; flipping the first substrate to bond the first plurality of light emitting diode chips on the plurality of the paired bonding pads; separating the first plurality of light emitting diode chips from the first substrate; and reheating the second substrate such that the first plurality of light emitting diode chips are fastened on the second substrate.

In a preferred embodiment, the first substrate can be sapphire or SiC and the first plurality of light emitting diode chips includes III-nitride for emitting UV, blue or green lights. The separating step is operated by using LASER exposure if the first substrate is sapphire or SiC.

In a preferred embodiment, the first substrate can also be a tape and the first plurality of light emitting diode chips includes III-arsenide or III-phosphide for emitting red light. The separating step is operated by pressing front side the first substrate without the plurality of light emitting diode chip if the first substrate is the tape.

In a preferred embodiment, the second substrate can be PCB, silicon, silicon carbide, or ceramic. The ceramic substrate may include AlN, or Aluminum oxide ($Al_2O_3$).

In a preferred embodiment, the second substrate can be GaAs and includes a second plurality of light emitting diode chips, each second light emitting diode chip of the second plurality of light emitting diode chips emitting light with a second wavelength longer than the first wavelength.

In a preferred embodiment, the driving circuit can be an active circuit array or a passive circuit array. The active circuit includes a plurality of transistors for driving the plurality of light emitting diode chips.

In a preferred embodiment, a first pitch in the first plurality of light emitting diode chips on the first substrate is equal to a second pitch in the plurality of paired bonding pads on the second substrate. The flipping step is operated to align the first plurality of light emitting diode chips to the plurality of paired Ohmic electrodes. The separating step is operated to the each first light emitting diode chip on the first substrate block-by-block.

In a preferred embodiment, a first pitch in the first plurality of light emitting diode chips on the first substrate is smaller than a second pitch in the plurality of paired bonding pads on the second substrate. The flipping step is operated to align one of the first plurality of light emitting diode chips to one of the plurality of paired Ohmic electrodes, and then the separating step is operated.

In a preferred embodiment, a phosphor layer is formed on the first plurality of light emitting diode chips for providing light with a third wavelength longer than first wavelength light after the LED chips are transferred to the bonding substrate.

In a preferred embodiment, lights with the third wavelength and the first wave length provide white light. The method may further comprise a step of providing a third transparent substrate, on the second substrate, with a color filter thereon after said reflowing step.

The present invention also provides a display panel, which comprises a GaAs substrate with a driving circuit thereon for the display panel and a plurality of paired bonding pads, said GaAs substrate including a plurality of red light emitting diode chips; and a plurality of GaN light emitting diode chips electrically fastening to the plurality of paired bonding pads.

The present invention also provides a display panel, which comprises a bonding substrate with driving circuits and a plurality of paired bonding electrodes thereon; a plurality of GaN light emitting diode chips electrically fastening to the plurality of paired bonding electrodes respectively; a phosphor layer, patterned as a plurality of regions suitable covering the plurality of GaN light emitting diode chips respectively; and a transparent substrate with a color filter layer thereon to align the plurality of GaN light emitting diode chips respectively.

In a preferred embodiment, the bonding substrate can be PCB, silicon, silicon carbide, or ceramic. The ceramic substrate may include AlN, or Aluminum oxide ($Al_2O_3$).

In a preferred embodiment, the driving circuit can be an active circuit array or a passive circuit array. The active circuit includes a plurality of transistors for driving the plurality of light emitting diode chips.

The present invention also provides a method for forming a display panel, which comprises steps of providing a sapphire substrate with a plurality of GaN light emitting diode chips thereon, wherein each of the plurality of GaN light emitting diode chips has a first electrode and a second electrode; providing a bonding substrate with driving circuits and a plurality of paired bonding electrodes thereon; transferring the plurality of GaN light emitting diode chips to the plurality of paired bonding electrodes; providing a phosphor layer on the plurality of GaN light emitting diode chips respectively; and fitting a transparent substrate with a color filter thereon to the bonding substrate such that the color filter will align to the plurality of GaN light emitting diode chips.

In a preferred embodiment, the bonding substrate can be PCB, silicon, silicon carbide, or ceramic. The ceramic substrate may include AlN, or Aluminum oxide ($Al_2O_3$).

In a preferred embodiment, the driving circuit can be an active circuit array or a passive circuit array. The active circuit includes a plurality of transistors for driving the plurality of light emitting diode chips.

The present invention also provides a display panel, which comprises a sapphire substrate with a plurality of GaN light emitting diode chips thereon, wherein each of the plurality of GaN light emitting diode chips has a first electrode and a second electrode; a first dielectric layer on said sapphire substrate with exposed of the first electrodes and the second electrodes; a first transparent conductive layer, patterned as a first plurality of signal lines, on the first dielectric layer to electrically connect to a row of the first electrodes of the plurality of the GaN light emitting diode chips; a second dielectric layer on said first dielectric layer and said first transparent conductive layer with exposed of the second electrode; a second transparent conductive layer, patterned as a second plurality of signal lines, on the second dielectric layer to electrically connect to a column of the second electrodes of the plurality of the GaN light emitting diodes; a passivation layer blanket covering said second dielectric layer and said second transparent conductive layer; a phosphor layer, patterned as a plurality of regions suitable covering the plurality of GaN light emitting diode chips, on the passivation layer; and a transparent substrate with a color filter layer thereon to cover and align with the plurality of GaN light emitting diode chips.

The present invention also provides a method for forming a display panel, which comprises steps of: providing a sapphire substrate with a plurality of GaN light emitting diode chips thereon, wherein each of the plurality of GaN light emitting diode chips has a first electrode and a second electrode; forming a first dielectric layer on the sapphire substrate and the plurality of GaN light emitting diode chips; exposing the first electrodes and the second electrodes; forming a first transparent conductive layer on the first dielectric layer; patterning the first transparent conductive layer to a first plurality of signal lines to electrically connect to a row of the first electrodes of the plurality of GaN light emitting diode chips; forming a second dielectric layer on the first dielectric layer and the first patterned transparent conductive layer; exposing the second electrodes; forming a second transparent conductive layer on the second dielectric layer; patterning the second transparent conductive layer to a second plurality of signal lines to electrically connect to a column of the second electrodes of the plurality of GaN light emitting diode chips; forming a passivation layer to cover the second patterned transparent conductive layer and the second dielectric layer; providing a phosphor layer on the passivation layer; and fitting a transparent substrate with a color filter layer thereon to the sapphire substrate such that color filter will align with the plurality of GaN light emitting diode chips.

The present invention also provides an apparatus, which comprises a platform for mounting a first substrate with a plurality of light emitting diode chips thereon; a first stage for providing a first motion with two horizontal directions orthogonal with each other; a mounting stage on said first stage for fastening a second substrate with a driving circuit and a plurality of paired bonding pads, wherein the plurality of light emitting diode chips face to the plurality of paired bonding pads; means for separating the plurality of light emitting diode chips from the first substrate; and a controller for controlling said platform, said first stage, said mounting stage and said separating means, such that the a display panel is formed.

In a preferred embodiment, the apparatus may further comprise a second stage between said first stage and said mounting stage for providing a vertical motion.

In a preferred embodiment, said separating means is an Excimer LASER when the first substrate is sapphire or SiC.

In a preferred embodiment, said separating means is a pressing device for pressing the plurality of light emitting diode chips to the plurality of paired bonding pads when the first substrate is a tape.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The present invention will be readily understood by the following detailed description in conjunction with the accompanying drawings, wherein the same or like reference numerals designate the same or like structural elements, and in which.

Figure 1A:
FIGS. 1A~1D are schematic representations of structures at various stages during the formation of LED chips on an epi-substrate in accordance with one embodiment of the present invention.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

As used herein, the term "substrate" generally refers to plates formed of a semiconductor or non-semiconductor material. Examples of such a semiconductor or non-semiconductor material include, but are not limited to, monocrystalline silicon, silicon carbide, gallium arsenide, indium phosphide, sapphire, ceramic, glass, and PCB. Such substrates may be commonly found and/or processed in semiconductor fabrication facilities. An epi-substrate refers to a plate provided for epitaxial growth in semiconductor fabrication facilities. A bonding substrate refers to a plate with circuits and bonding pads thereon for receiving electronic devices.

For the substrate, one or more layers may be formed upon the substrate. Many different types of such layers are known in the art, and the term substrate as used herein is intended to encompass a wafer on which all types of such layers may be formed. One or more layers formed on a substrate may be patterned. For example, a substrate may include a plurality of dies/chips, each having repeatable patterned features. Formation and processing of such layers of material may ultimately result in completed semiconductor devices. As such, a substrate may include a plate on which not all layers of a complete semiconductor device have been formed or a substrate on which all layers of a complete semiconductor device have been formed.

The substrate may further include at least a portion of an integrated circuit (IC), or optoelectronic devices such as LED chips.

The term "LED" generally refers to light emitting diode which can emit red, green, blue, or UV light by driving a specific direct current, with or without package.

The term "LED chip" generally refers to LED formed by using epitaxial growth on a substrate with a paired Ohmic contact electrodes, with or without being separated from the epi-substrate. The LED chip in the present invention can be formed on the epi-substrate or bonded to the bonding substrate.

Typical LED chip has a dimension about 14×14 mil$^2$ which is 355.6×355.6 μm$^2$, and the micro LED chip has a dimension ranged generally less than 100×100 μm$^2$, and a preferred dimension ranged less than 50×50 μm$^2$.

The term, "circuit", in the present invention may include resistors, diodes, or transistors.

The term, "index", in the present invention refers to a pitch between two LED chips on epi-substrate or bonding substrate.

The term, "color filter", is used to filter light in a plurality of wavelength bands. In the present invention, color filter refers to RGB filter which let red, green, and blue light pass through respectively.

Steps of the process flow in the present invention should be exchangeable generally, unless a logical sequence is required.

The conductive type of semiconductor in the present invention, such as n-type or p-type conductivity in the semiconductor layer, should be exchangeable.

Various example embodiments of the present invention will now be described more fully with reference to the accompanying drawings in which some example embodiments of the invention are shown. Without limiting the scope of the protection of the present invention, all the description and drawings of the embodiments will exemplarily be referred to micro LED display and manufacture method thereof. However, the embodiments are not be used to limit the present invention to micro LED transfer method.

In the drawings, relative dimensions of each component and among every component may be exaggerated for clarity. Within the following description of the drawings the same or like reference numbers refer to the same or like components or entities, and only the differences with respect to the individual embodiments are described.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

The present invention provides a method which the micro LED chips can be transferred to a bonding substrate directly, wherein the bonding substrate not only includes driving circuits but also is provided for display. At first, for III-nitride based compound, GaN-based are formed by using epitaxial growth on a sapphire, SiC, Si, GaN, or ZnO substrate for providing green, blue, or UV light. For III-arsenide or III-phosphide compound, GaAs-based or AlInGaP are formed by using epitaxial growth on GaAs, GaSb, GaP, or InP substrate for providing red lights. After epitaxial growth process, the epi-layers are processed with chip patterns and Ohmic contact electrodes are formed on the p/n epi-layers respectively. A bonding substrate with driving circuits and bonding pads formed thereon is provided to receive the micro LED chips. III-nitride micro LED chips on sapphire substrate can be transferred using LASER lift-off technology, and III-arsenide, III-phosphide micro LED chips or III-nitride micro LED chips on SiC, Si, ZnO substrate can be transferred by using mechanical pressing method. The mass transfer procedure can be operated block-by-block simultaneously for equal index or chip-by-chip sequentially for non-equal index, or whole substrate transfer directly. Then, the bonding substrate with the transferred micro LED chips is reheated such that the bonding pads and the micro LED chips can be bonded by using eutectic bonding, soldering bonding or silver epoxy baking. Hence, the mass transfer issue can be solved in industrial and commercial concerns.

In one embodiment, one pixel of the display can include a blue micro LED chip, a green micro LED chip, and a red micro LED chip. In another embodiment, one pixel of the display may include a blue micro LED chip, a blue micro LED chip with green phosphor coated thereon, and a blue micro LED chip with red phosphor coated thereon. In another embodiment, one pixel of the display may include a blue micro LED chip, a green micro LED chip, and a blue micro LED chip with red phosphor coated thereon. In another embodiment, one pixel of the display may include three UV micro LED chips with RGB phosphors respectively coated thereon. In another embodiment, one pixel of the display may include only one blue micro LED chip for monochromatic display. In one embodiment, one pixel of the display may include three micro LED chips with yellow phosphor all coated thereon, and a RGB color filter thereafter will filter the white light into full color image. In this embodiment, functions of the RGB filter will be similar as that in the TFT LCD. In this embodiment, in order to fulfill wide color gamut, red phosphor or quantum dot technologies can be adapted in this embodiment. The red phosphor may include nitride phosphor. Or, white phosphor with enhanced red light, such as KSF (Potassium Fluoride Silicon) phosphor and TriGain phosphor developed by GE. Sharp also develops a WCG phosphor which includes β-SiAlON green phosphor and KSF phosphor.

In one embodiment, the bonding substrate can be GaAs and red micro LED chips as well as driving circuits can be formed on the GaAs. Thus, only blue and green micro LED chips need to be transferred to the bonding substrate. Or, blue micro LED chip with green phosphor, such as silicate phosphor or β-SiAlON green phosphor, on the blue micro LED chips are transferred to the bonding substrate.

Turning now to the drawings, it is noted that the present invention will be explained more clear with drawings.

In FIG. 1A, a substrate 10 for epitaxial growth, which may be Si, SiC, ZnO, GaN, sapphire ($Al_2O_3$), GaAs, GaSb, GaP or InP, is provided. However, GaAs and sapphire are preferred in one embodiment of the present invention as epi-substrate. For III-nitride compound, the epi-substrate 10 would be sapphire, SiC, Si, ZnO, or GaN, while for the III-arsenide compound, the substrate 10 would be GaAs, GaSb, GaP or InP. The orientation of the substrate 10 is selected for III-arsenide, III-phosphide, or III-nitride compound epitaxial growth. In one embodiment, sapphire substrate can be patterned sapphire substrate to enhance brightness.

Figure 1B:
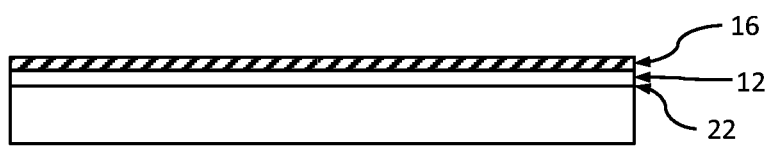

In FIG. 1B, an epitaxial-growth process is provided for forming epi-layers. A first epi-layer 12 with a first conductivity is formed on the epi-substrate 10, and a second epi-layer 16 with a second conductivity is formed on the first epi-layer 12. The second conductivity is opposite to the first conductivity. In a preferred embodiment, the first conductivity is n type and the second conductivity is p type. A single quantum well layer or multiple quantum well layer (not shown in FIG. 1B) is always formed between the first epi-layer 12 and the second epi-layer 16 by using conventional arts. For sapphire, SiC, and Si epi-substrate 10, a low temperature buffer layer 22 is formed before the first epi-layer 12 is formed, to promote a two-dimensional growth. In this invention, green, blue, or UV light can be emitted by the III-nitride compounds, while red light can be emitted by the III-arsenide compounds or III-phosphide compounds. In one embodiment, the epi-layers 12 and 16 can be $Al_xGa_{(1-x)}As$, $(Al_xGa_{(1-x)})_yIn_{(1-y)}P$, y~0.5 (lattice match to GaAs), or $Al_xIn_yGa_{(1-x-y)}N$. In one embodiment, the epi-layers 12 and 16 will emit blue light.

Figure 1C:
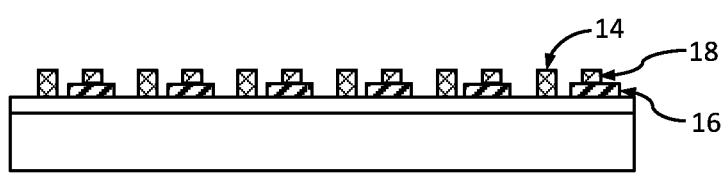

In FIG. 1C, two electrodes are formed on the first and second epi-layers respectively. A portion of the second epi-layer 16 is removed away by using conventional patterning method which includes lithographic step and etching step, and for etching step, anisotropic etching method would be preferred. A first ohmic contact electrode 14 is then formed on the first epi-layer 12 by lift-off method, or depositing an ohmic contact material layer on the first-epi-layer 12 and unnecessary portions of the ohmic contact layer are removed by using conventional patterning method which includes steps of conventional lithographic and etching steps. Materials of the first ohmic contact electrode 14 can be Ge/Au, Pd/Ge, CrAu, CrAl, Ti, TiN, Ti/Al, Ti/Al/Ni/Au, Ta/Ti/Ni/Au, V/Al/V/Au, V/Ti/Au, V/Al/V/Ag, IZO, or ITO for III-nitride, III-phosphide, or III-arsenide compound, respectively. A second ohmic contact electrode 18 is formed on the second epi-layer 16 by lift-off method, or depositing an ohmic contact material layer on the second epi-layer 18 and unnecessary portions of the ohmic contact layer are removed by using conventional patterning to etch method which includes steps of lithographic method and etching method. Materials of the second electrode 18 may be a high work-function metal such as Ni, Au, Ag, Pd, Pt, AuBe, AuZn, PdBe, NiBe, NiZn, PdZn, AuZn, Ru/Ni/ITO, Ni/Ag/Ru/Ni/Au, Ni/Au or ITO for III-nitride, III-phosphide, or III-arsenide compound, respectively. The lift-off method in the ohmic contact electrodes formation process in this embodiment includes steps of depositing photoresist layers first on the epi-layers 12 or 16, exposing and developing the photoresist layers with patterns, depositing the ohmic contact material layer on the photoresist layer and exposed epi-layers 12 or 16, and then removing the photoresist layer directly. The ohmic contact material layer on the photoresist layer will be removed at the same time. The lift-off method takes the advantage of omission one etching step.

Figure 1D:
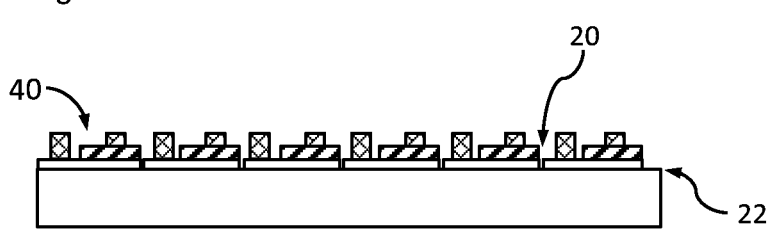

In FIG. 1D, a mesa etching process is conducted and scribe lines 20 are formed at the same time by using conventional patterning to etch method to distinct every LED chip 40. The formation of the ohmic contact electrodes and mesa is so called chip process and the step sequence of forming ohmic contact electrode in FIG. 1C and forming mesa in FIG. 1D can be switched or reversed. A passivation layer, with openings for the first/second ohmic contact electrode, can be formed on the micro LED chips to protect all micro LED chips, although it is not shown in Figures for not to defocus the present invention.

Figure 2A:
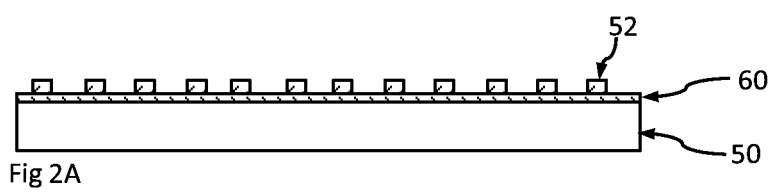
FIGS. 2A and 2B are schematic representations of structures at various stage during the prepare of transferring micro LED chips from epi-substrate to display in accordance with one embodiment of the present invention.

In FIG. 2A, a bonding substrate 50 is provided with driving circuits 60 and paired bonding pads 52 thereon. The bonding substrate 50 can be PCB, silicon, silicon carbide, AlN ceramic or Aluminum oxide ($Al_2O_3$) ceramic, glass, or GaAs. The driving circuits 60 and paired bonding pad 52 formation methods may be any conventional art. Backside of the bonding substrate 50 is preferred flat. If LLO should be conducted later, backside of the bonding substrate 50 should be polished.

Figure 2B:
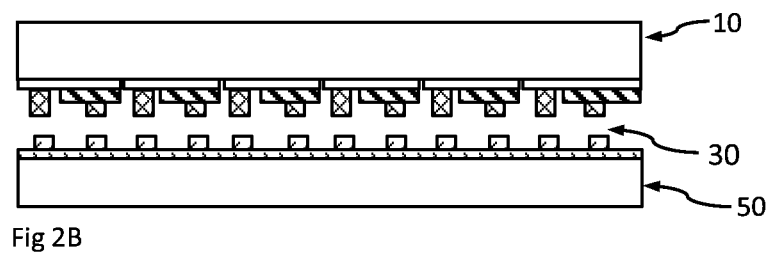

Micro LED chips will be transferred to the bonding substrate. In FIG. 2B, the processed epi-substrate 10 in FIG. 1D is flipped and each LED chip 40 is aligned to each paired bonding pads 52 for the index on the epi-substrate is the same to that on the bonding substrate. The bonding pads 30 may include eutectic bonding, soldering bonding, and epoxy paste with silver.

Figure 3A:
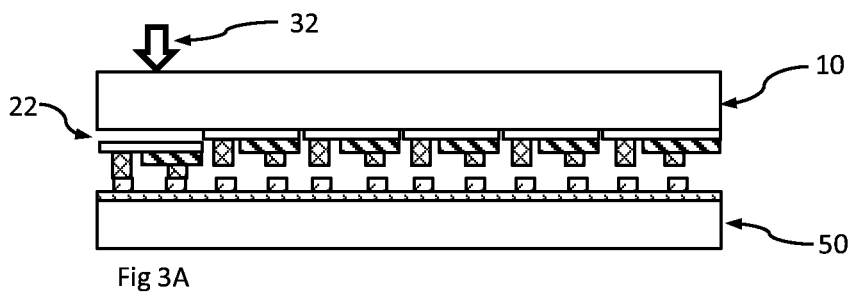
FIGS. 3A~3C are schematic representations of structures at various stages during the LASER lift-off process in accordance with one embodiment of the present invention.

Then, a chip-by-chip LASER exposure is introduced in FIG. 3A. In this embodiment, only one chip is at a time transferred for a specific LED colors. However, a block of LEDs can be transferred simultaneously if all LEDs emit the same color in other applications or embodiments. A first LED chip is illuminated by LASER exposure 32 to the low temperature buffer layer 22 such that GaN epi-layer 12 will be separated from the sapphire epi-substrate 10. Thus, the first LED chip is separated from the epi-substrate 10. Please notice in FIG. 3A that ohmic contact electrodes are very close to the paired bonding pads; however they do not exactly contact. The epi-substrate 10 has to be close to the bonding substrate 50 enough such that, when the first LED chip is exposed to LASER, the first LED chip will be separated from the epi-substrate 10 and transferred to the bonding substrate 50 directly. For some other conventional LASER lift-off process, the micro LED chips are bonded to the paired bonding pads first and then illuminated by LASER exposure. In the present invention, LASER exposure is operated first such that micro LED chips can be bonded to the bonding substrate 50 selectively. Recipes such as wavelength, LASER power, beam size and shape, and exposure time can be any conventional art. In one embodiment, KrF Excimer LASER can be applied with wavelength 248 nm, pulse about 3-10 ns, and energy density about 120-600 $mJ/cm^2$. In another embodiment, Nd:YAG LASER can be applied with wavelength 355 nm, pulse about 20-50 ns, energy density about 250-350 $mJ/cm^2$. In this embodiment, although sapphire epi-substrate is used, however silicon carbide epi-substrate can be applied in the LASER lift-off and details can be referred to Nakamura et al. published by U.S. Pat. No. 7,825,006.

Figure 3B:
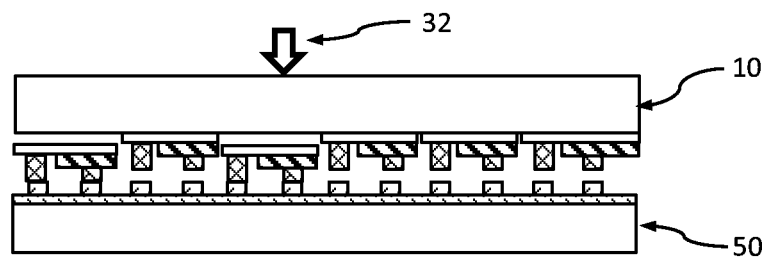
Figure 3C:
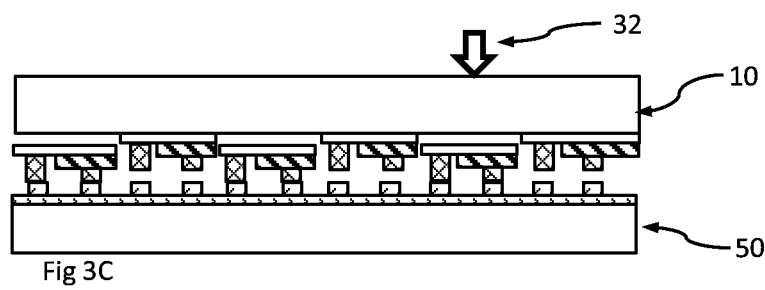

In FIG. 3B, a second LED chip is illuminated by LASER exposure 32 to the low temperature buffer layer 22. Thus, the second LED chip is separated from the epi-substrate 10 and dropped on the bonding substrate. And in FIG. 3C, a third LED chip is illuminated by LASER exposure 32 to the low temperature buffer layer 22. Thus, the third LED chip is separated from the epi-substrate 10 and transferred on the bonding substrate. Please also notice in FIG. 3 that the first, second, and third micro LED chips are not neighbors because some other micro LED chips, which can emit different light, from some other epi-substrate can be bonded to this bonding substrate. In one embodiment, the first, second, and third micro LED chips can emit blue light, and other micro LED chips on other epi-substrate which may emit green light should be bonded to this bonding substrate. Red LED chips may be formed in the bonding substrate already if the bonding substrate is GaAs. If red micro LED chips should be bonded to the bonding substrate and the bonding substrate per se is not GaAs, the interval between the blue micro LED chips should be doubled to that in FIG. 3.

After all selective blue micro LED chips are illuminated by LASER exposure, the selective blue micro LED chips are transferred to the bonding substrate. The remaining blue micro LED chips on the epi-substrate can be processed to next bonding substrate.

In FIG. 3, each micro LED chip can be transferred chip-by-chip sequentially or block-by-block.

Figure 4A:
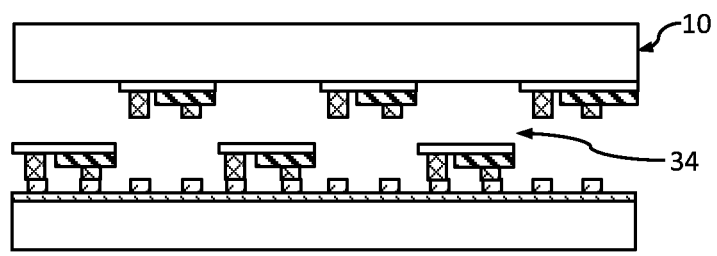
FIGS. 4A and 4B are schematic representations of structures at various stages during the separation between the epi-substrate and bonding substrate in accordance with one embodiment of the present invention.

In FIG. 4A, the epi-substrate 10 is moved out 34 while some micro LED chips irradiated by LASER exposure are stayed on the bonding substrate 50, while other LED chips without being irradiated by LASER exposure are remained on the epi-substrate 10.

Figure 4B:
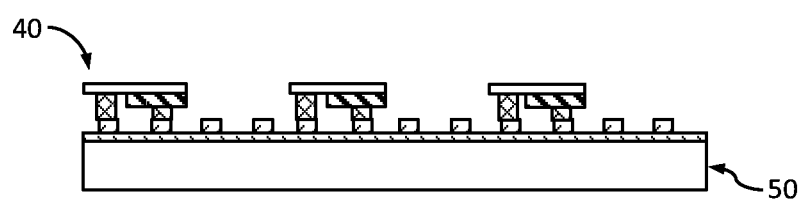

In FIG. 4B, the bonding substrate 50 can be reheated by using eutectic bonding, soldering bonding, or baked epoxy with silver, such that the transferred micro LED chips are bonded to the paired bonding pads. It would be preferred that this step is operated when all micro LED chips have been transferred.

Figure 5A:
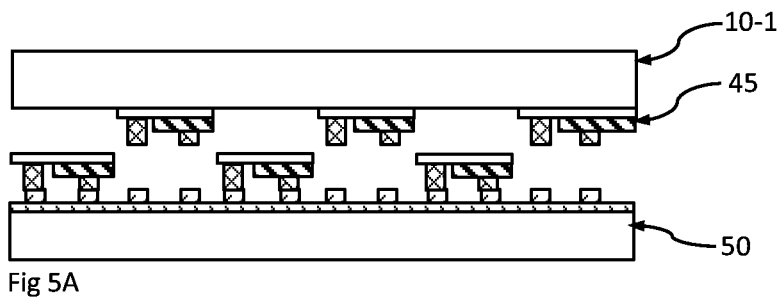
FIGS. 5A~5D are schematic representations of structures at various stages during the formation of another LED chips on the bonding substrate in accordance with one embodiment of the present invention.
Figure 5B:
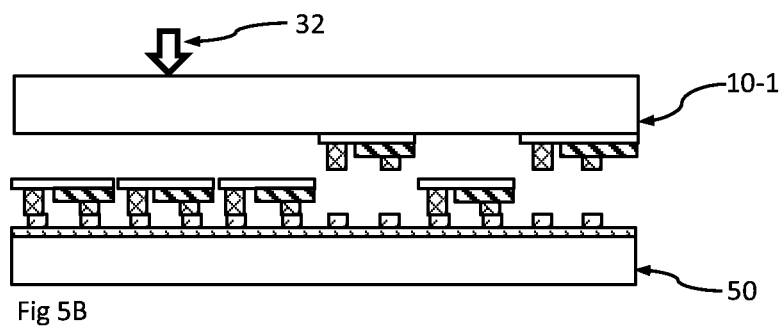
Figure 5C:
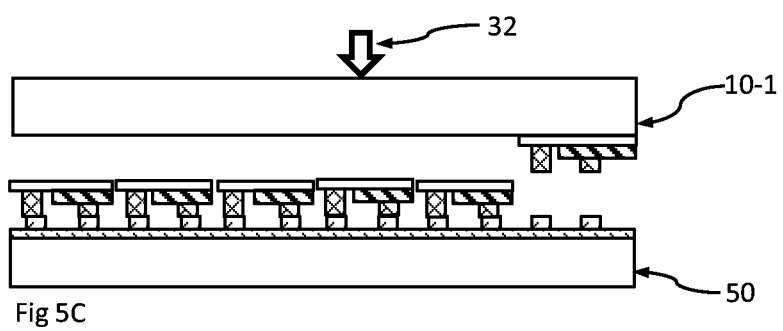
Figure 5D:
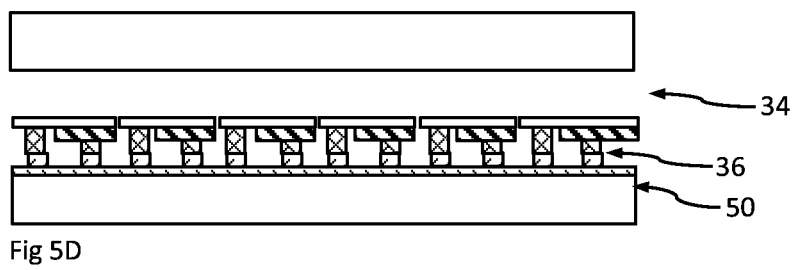

In FIG. 5A, a second epi-substrate 10-1 with other micro LED chips 45, such as green LED chip, is flipped and all micro LED chips 45 are aligned to the remained paired bonding pads. In this embodiment, some green micro LED chips 45 on the epi-substrate may have been processed on the other bonding substrate. Then, as shown in FIG. 5B, the epi-substrate 10-1 is located to close the bonding substrate 50 enough, but distance between the epi-substrate 10-1 and the bonding substrate 50 should have a thickness larger than a chip thickness, such as several micrometers apart, for chip clearance consideration, and one LED chip 45 is irradiated by LASER exposure 32. In FIG. 5C, another LED chip 45 is irradiated by LASER exposure 32 again to the low temperature buffer layer again. Thus, all micro LED chips are separated from the epi-substrate 10-1, and transferred to the bonding substrate 50 chip-by-chip. In FIG. 5D, the epi-substrate 10-1 is moved away and all LED chips are transferred 34. The bonding substrate 50 is again reheated. For conveniently, the reheating step should be processed after all micro LED chips have been transferred to the bonding substrate.

The bonding substrate 50 can be merged, separated or singulated in a display panel, if the bonding substrate has small or large size. For example, if the bonding substrate is a two by two inch plate and the display device is six by two inch, three bonding substrates need to be merged into a single display panel. If the bonding substrate is a ten by twelve inch plate and the display is six by three inch, the bonding substrate needs to be separated or singulated into nine display panels.

Figure 6A:
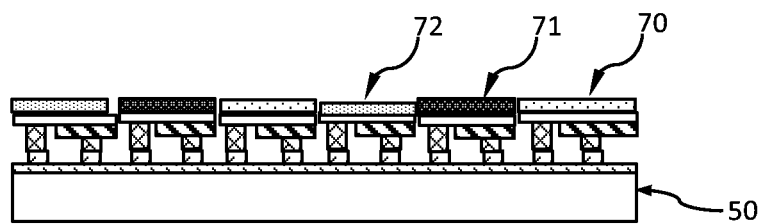
FIGS. 6A~6C are schematic illustrations of phosphor on LED chips in accordance with one embodiment of the present invention.
Figure 6B:
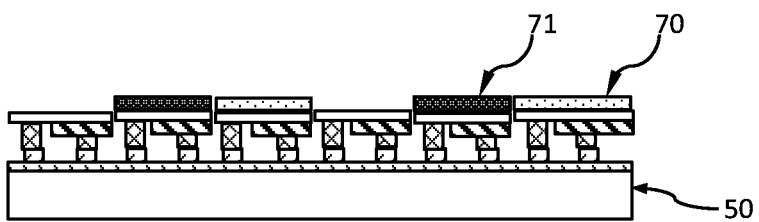
Figure 6C:
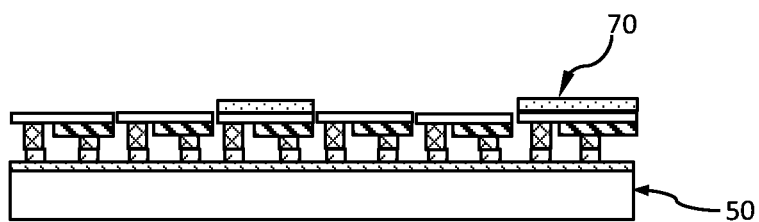

If all LED chips can be UV light LED, red phosphors 70, green phosphor 71, and blue phosphor 72 can be formed on the backside of micro LED chips as shown in FIG. 6A. In FIG. 6B, only blue LED chips are provided while green phosphor 71 and red phosphors 70 are formed or coated on the LED chips. The phosphors 70 can be formed by spraying, lithography, taping, or printing. Another embodiment shown in FIG. 6C, if blue and green micro LED chips are provided, only red phosphor 70 are formed and coated on some of blue LED chips. Thus, a display is fabricated.

Figure 7A:
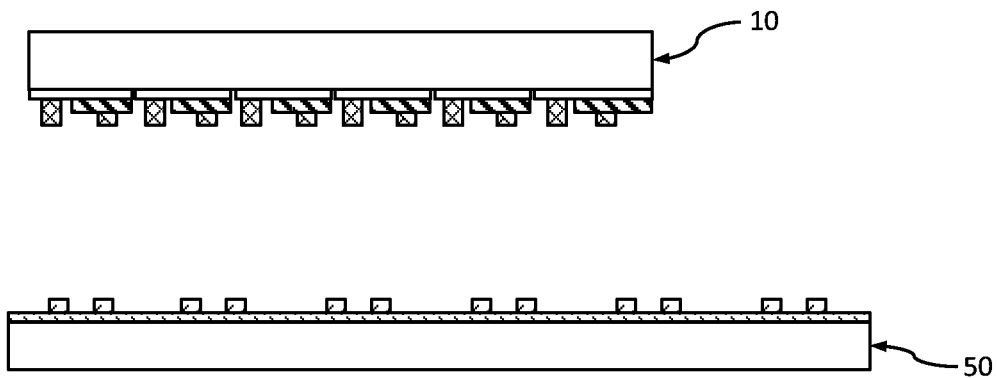
FIGS. 7A~7G are schematic representations of structures at various stages during the formation of LED chips on the bonding substrate with in accordance with another embodiment of the present invention.
Figure 7B:
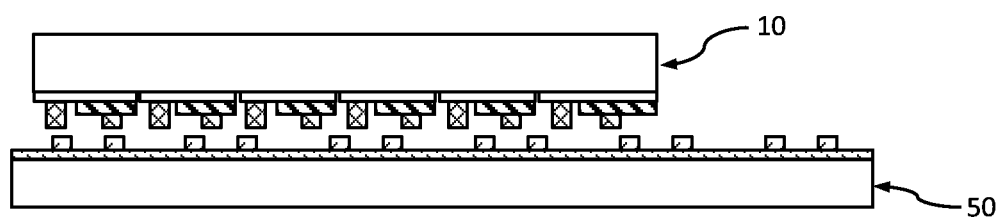

In another embodiment, if index of micro LED chip on the epi-substrate is not equal to that on bonding substrate, the LED chips on the epi-substrate should be transferred one-by-one. First, the first micro LED chip on the epi-substrate is aligned to specific paired bonding pads, as shown in FIG. 7A. Then, in FIG. 7B, the epi-substrate is moved close to the bonding substrate enough.

Figure 7C:
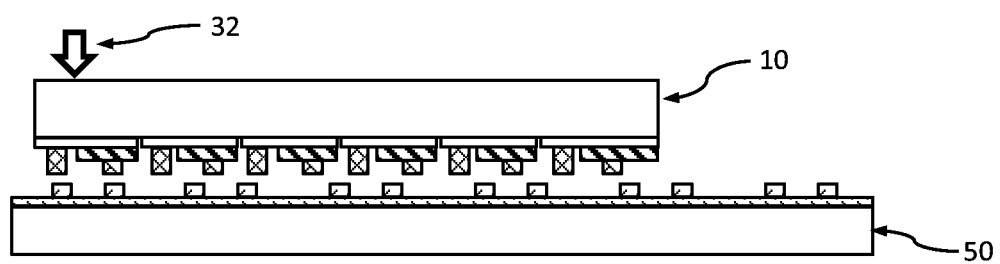
Figure 7D:
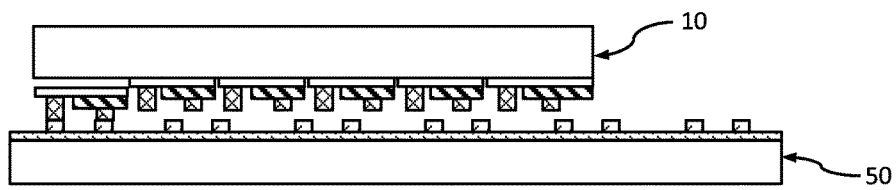

Then in FIG. 7C, the first micro LED chip is illuminated by LASER exposure 32. Thus, in FIG. 7D, the first micro LED chip is separated from the epi-substrate 10 and attach to the bonding substrate 50, while the other micro LED chips are still remain on the epi-substrate.

Figure 7E:
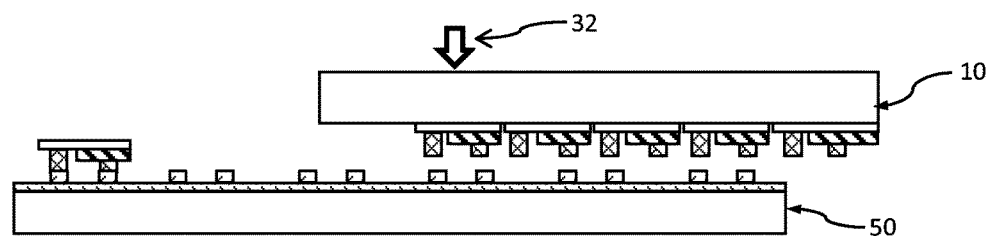
Figure 7F:
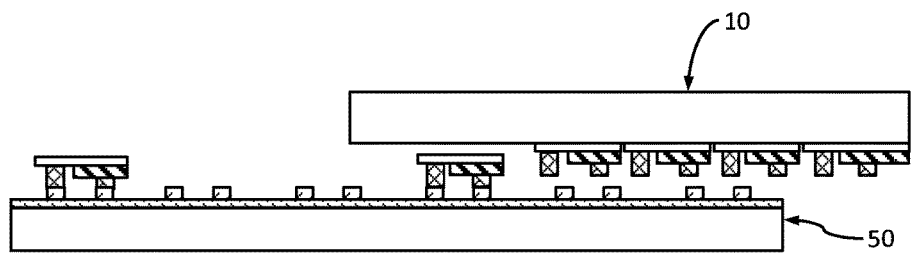
Figure 7G:
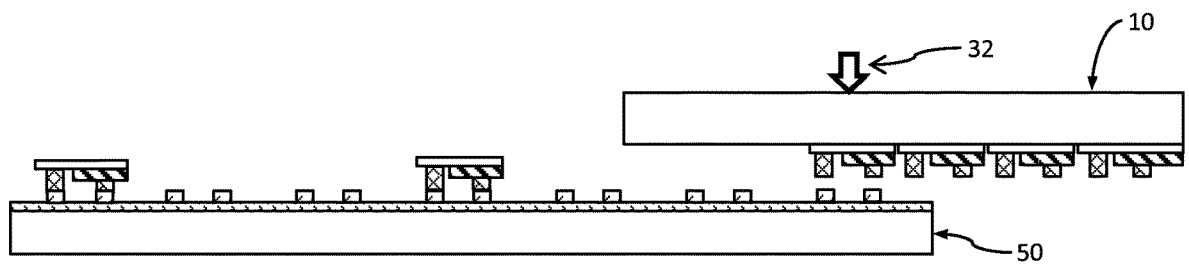

Then, in FIG. 7E, the epi-substrate 10 and the bonding substrate are moved such that the second LED chip is aligned to another paired bonding pads and illuminated by the LASER exposure 32. In FIG. 7F, the second LED chip is transferred to the bonding substrate 50. In FIG. 7G, the epi-substrate 10 and the bonding substrate are moved such that the third LED chip is aligned to another paired bonding pads and illuminated by the LASER exposure 32 again. Thus, the process can be continued till all specified micro LED chips are transferred to the bonding substrate. In this embodiment, index of micro LED chips on the epi-substrate is small than that of the paired bonding pads on the bonding substrate.

In the present invention, the sapphire substrate can be separated by using the LASER lift-off method. However, for some other epi-substrate, such as silicon, silicon carbide, and GaAs, it's not easy to separate the epi-substrate from the epi-layers by using LASER lift-off. Hence, another method is provided. In one embodiment, red micro LED chips can be formed on GaAs substrate, and then the red micro LED chips are transferred to a temporal substrate. The GaAs substrate is removed away by using selective etching method, and then all micro LED chips are transferred again to a tape as a substrate. Because the tape is soft and the stickiness between the micro LED chips and the tape is not so tight, the micro LED chips can be pressed to the bonding substrate directly by using a tip. Thus, the previous LASER lift-off method now can be replaced by mechanical pressing method. The stickiness of the tape can be controlled such that transferring can be optimized.

In order to explain this embodiment, some drawings should be introduced for more clarity.

Figure 8A:
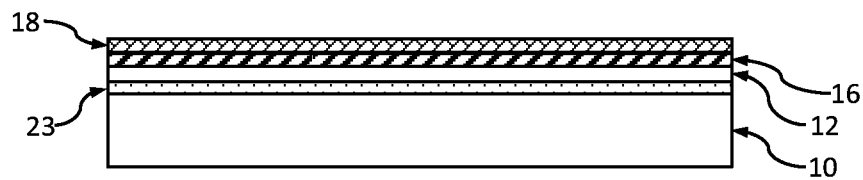
FIGS. 8A~8E are schematic representations of structures at various stages during the formation of LED chips transferred to a temporal substrate in accordance with one embodiment of the present invention.
Figure 8B:
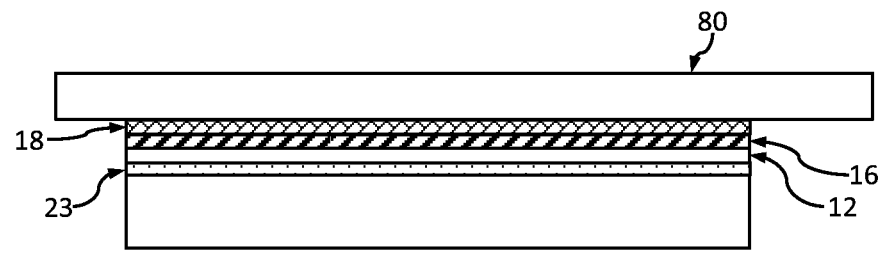

In one embodiment, a GaAs epi-substrate 10 is provided first. Then, an etching selective layer 23, such as AlAs, is formed on the GaAs substrate by using conventional epitaxial growth method, as shown in FIG. 8A. Then, the first epi-layer 12 and the second epi-layer 16 are sequentially formed by epitaxial growth and individual LED chip patterns will be formed later. A p ohmic contact layer 18 is formed on the second epi-layer 16 by using evaporating method. Then, the upper side of the epi-substrate 10 is fastened to a temporal substrate 80 by using specific glue which can lose stickiness when illuminated by UV or heated to some specific temperature, as shown in FIG. 8B.

Figure 8C:
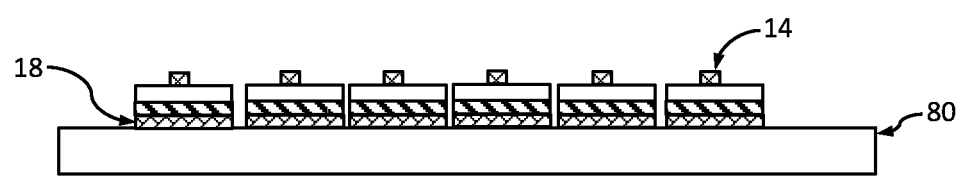
Figure 8D:
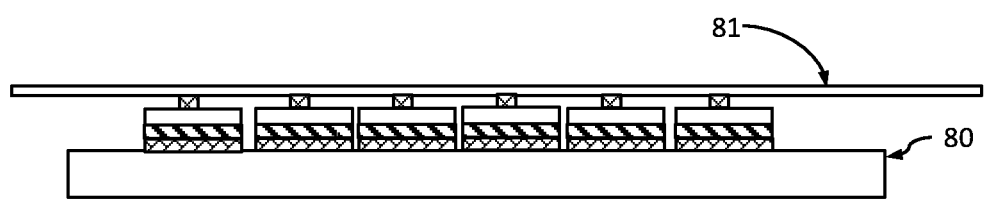
Figure 8E:
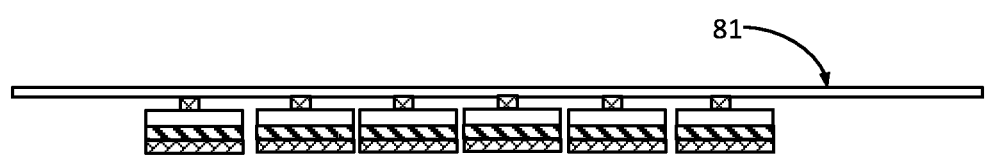

Next, the epi-substrate 10 is removed by etching the etching selective layer 23 (detail procedure of this process can be referred to US publication number 2006/0286694), and LED chips with n ohmic contact electrode 14 and p ohmic contact electrode 18 are formed on the epi-layer, as shown in FIG. 8C. The temporal substrate 80 is flipped. Then, the upper side of n ohmic contact electrode 14 is fastened to a tape 81 as shown in FIG. 8D. The stickiness of the tape is not too sticky or glutinous such that each micro LED chip can be dropped by simple mechanical pressing later. The temporal substrate 80 is then removed by heating or being illuminated by UV light and the tape with LED chips is flipped as shown in FIG. 8E. Another embodiment to remove the GaAs substrate is to etch the GaAs substrate directly with an etching stop layer, such as AlAs, directly formed on the GaAs substrate. The process flow of this embodiment is similar to the description above.

For other epi-substrate, such as Si, SiC, GaN, ZnO, GaP, and GaSb, a respective selective etching layer should be formed before the epi-layers are formed, and the former method can be applied. For silicon carbide epi-substrate, a transitional metal nitride layer is suitable as selective etching layer.

Figure 9:
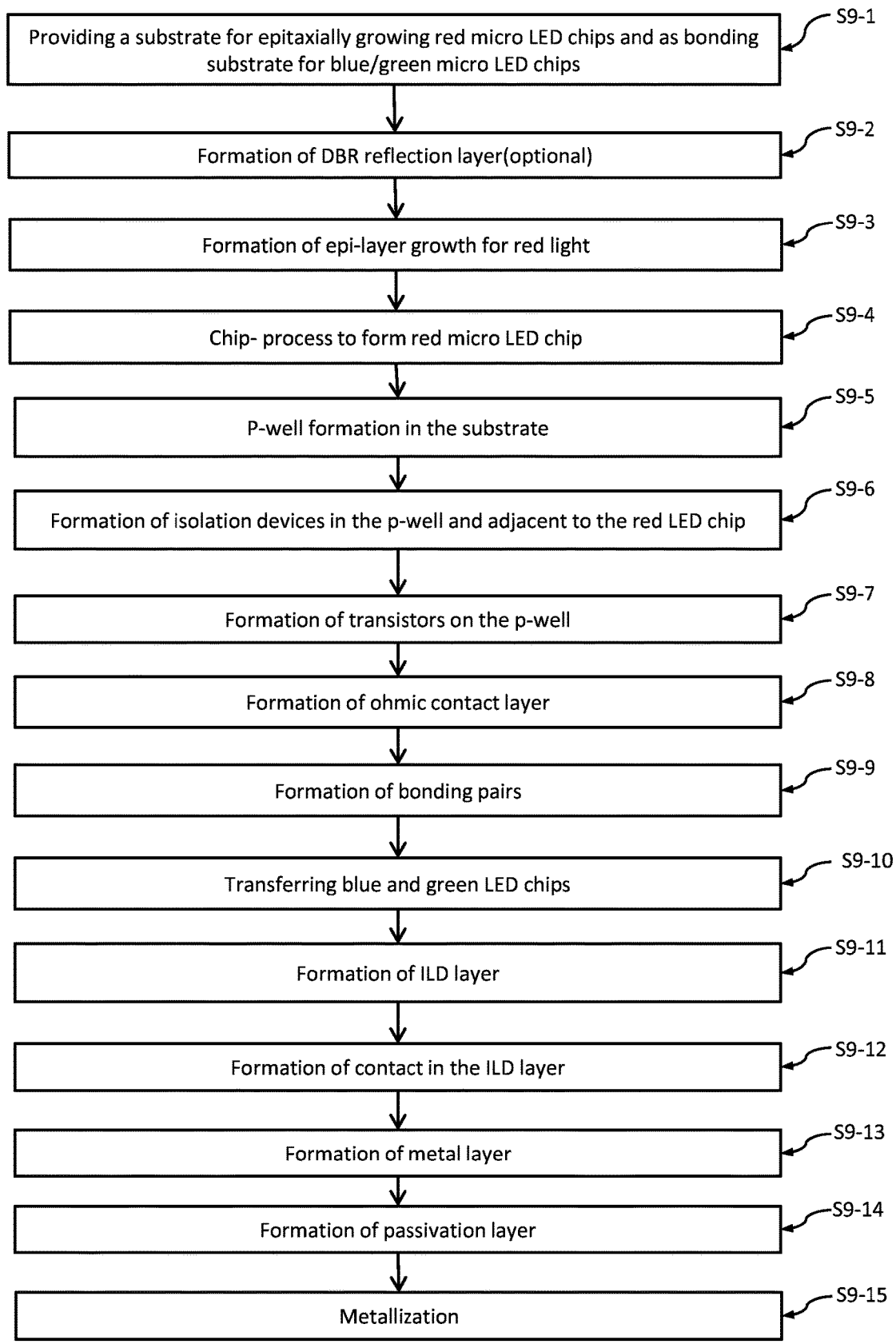
FIG. 9 is a flow diagram showing the steps for forming red LED chips and driving circuits on the bonding substrate in accordance with one embodiment of the present invention.

Epi-substrate can be used as bonding substrate with driving circuits, and AlGaInP red LED structure grown on GaAs substrate is provided to illustrate this embodiment. In FIG. 9, a process flow is provided for illustrating this embodiment. First, a substrate such as GaAs or InP is provided for epitaxially growing red micro LED chip structures and as a bonding substrate for blue/green micro LED chips, as shown in step S9-1. Then, as an optional step S9-2, a DBR layer is formed on the substrate for reflecting red light, and red LED structure is epitaxially grown on the DBR layer as the step S9-3. Next, red micro LED chips are made on the DBR layer as the step S9-4. A p-well is then formed into the GaAs substrate as the step S9-5 by using conventional ion-implantation and/or diffusion. In this embodiment, p-well is formed because the substrate is n-type. If a p-type MISFET is preferred, n-well should be formed in this step. Then, a plurality of isolation zones is formed in the p-well as the step S9-6 for isolating the following formed transistors from paired bonding pads. The isolation zones can be, for example, silicon nitride, silicon oxide, aluminum oxide, or aluminum nitride. Then transistors, in this embodiment are MISFET (metal-insulator-semiconductor field effect transistor), are formed in the p-well as the step S9-7. The GaAs substrate will be provided as semiconductor layer in the MISFET. Then an ohmic contact matrix is formed to ohmic contact micro LED chips as the step S9-8, and paired bonding pads are formed on the isolation devices as the step S9-9. Blue and green micro LED chips then can be transferred to the paired bonding pads as step S9-10. An ILD (inter-level dielectric) layer, such as silicon oxide or silicon nitride, is formed on the substrate as the step S9-11, and several contacts are formed in the ILD layer as step S9-12. Then, a metal layer is then formed on the ILD layer to electrically connect to the contact as step S9-13. A passivation layer, such as silicon oxide or silicon nitride, is formed to cover all transistors, micro LED chips, and the metal layer as step S9-14, and backside of the substrate is optionally metallization as step S9-15.

Figure 10A:
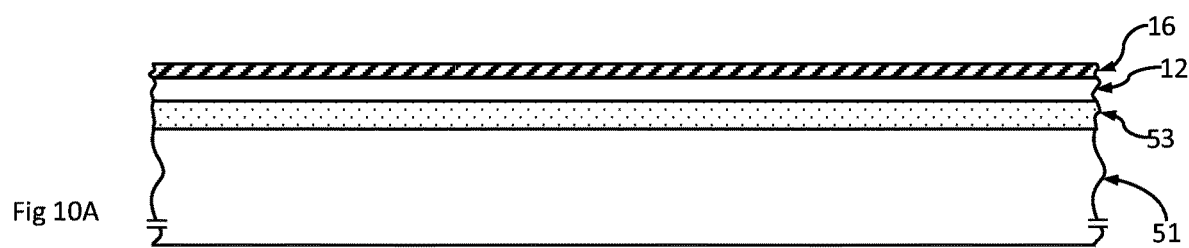
FIGS. 10A~10M are schematic representations of structures at various stages during the formation of red LED chips and driving circuits with blue/green LED chips transferred on the bonding substrate in accordance with another embodiment of the present invention.
Figure 10B:
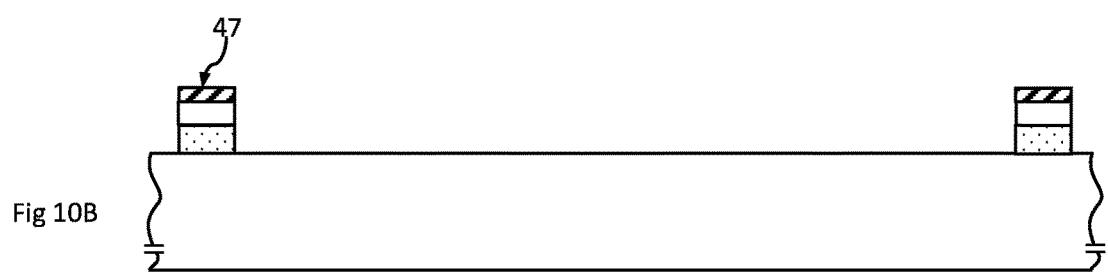
Figure 10C:
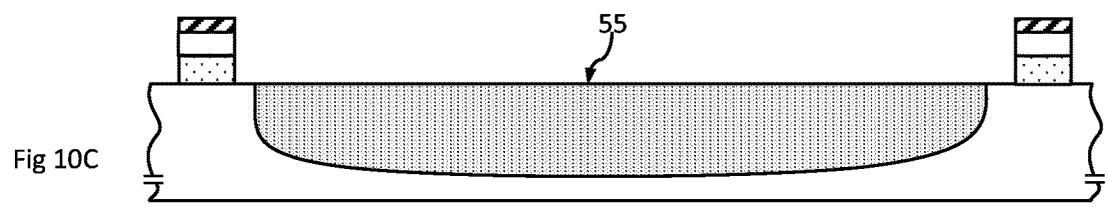
Figure 10D:
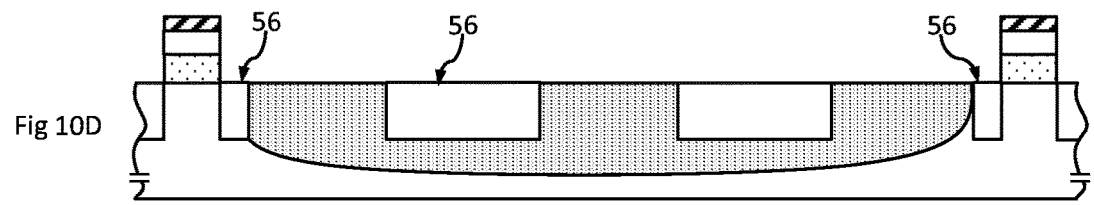
Figure 10E:
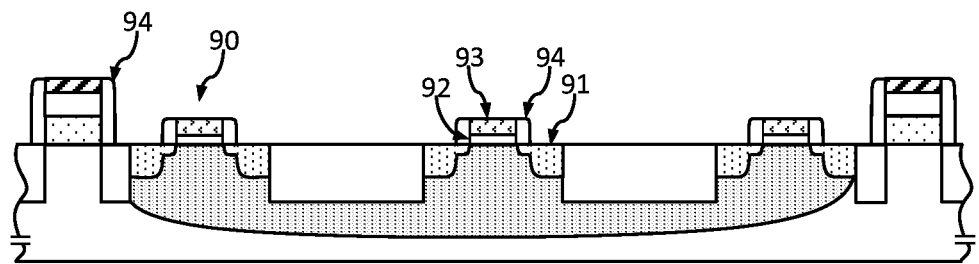
Figure 10F:
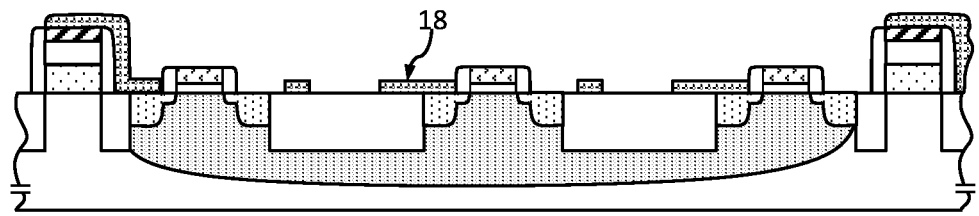
Figure 10G:
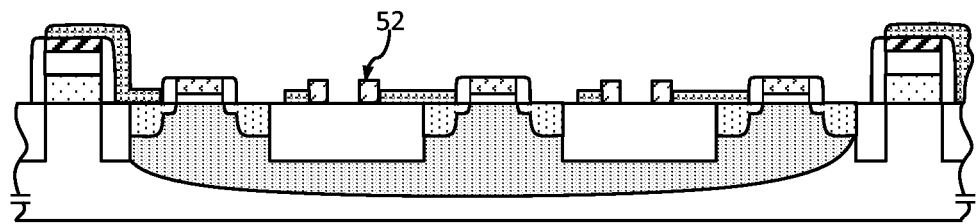
Figure 10H:
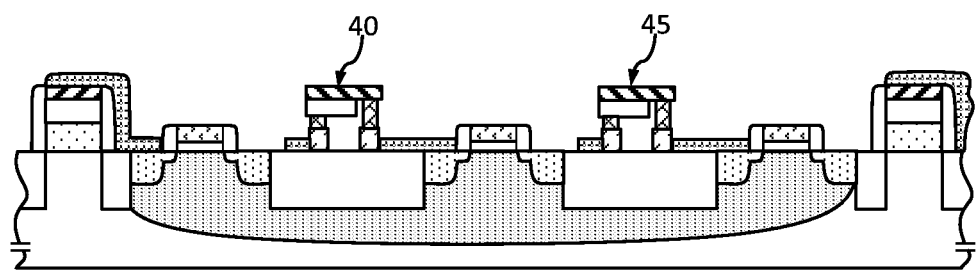
Figure 10I:
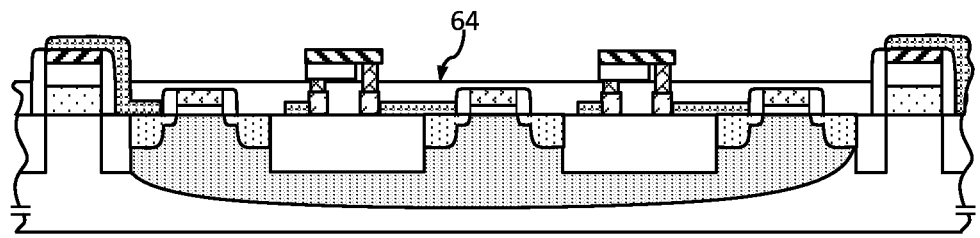
Figure 10J:
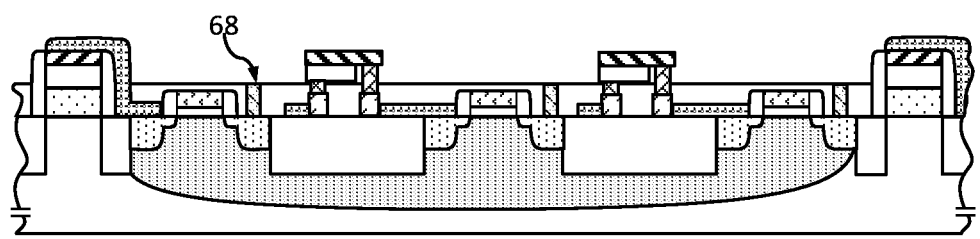
Figure 10K:
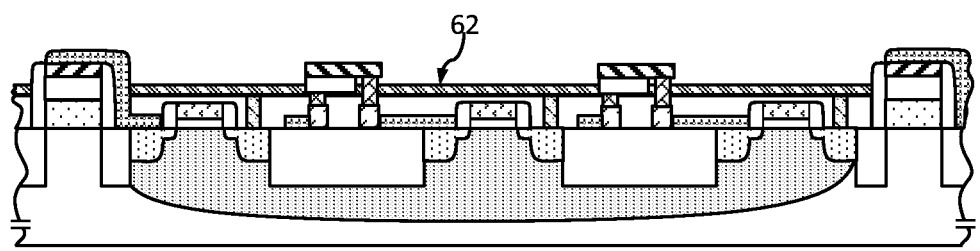
Figure 10L:
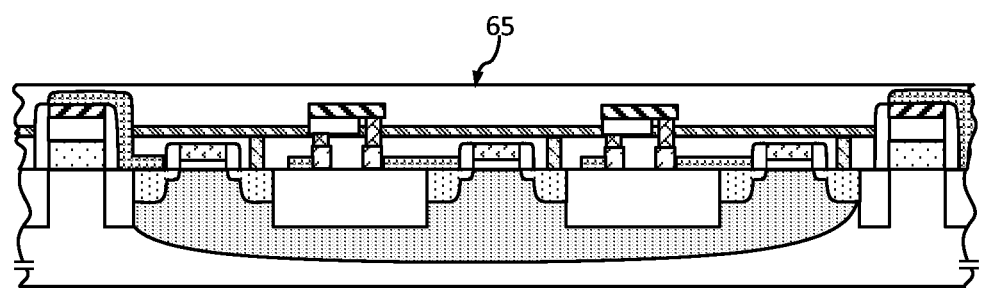
Figure 10M:
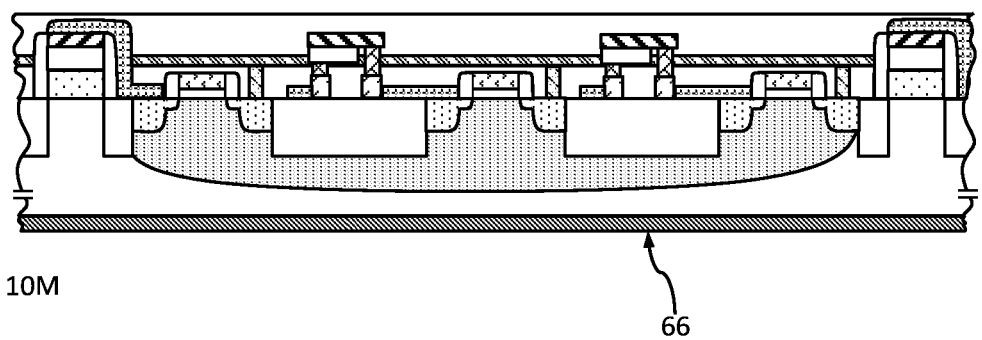

Detail steps of the process flow shown in FIG. 9 can be referred to FIGS. 10A 10M. First, a GaAs or InP substrate 51 is provided, as shown in FIG. 10A. A DBR layer 53 can be formed on the substrate 51 for enhancing red light extraction, and then, an n epi-layer 12 and a p epi-layer 16 are subsequently formed on the DBR layer 53 by MOCVD. A chip process is employed to form individual red micro LED chips 47 on the substrate 51, as shown in FIG. 10B, by using conventional patterning and etching processes. In order to form driving circuits, a p-well 55 is formed by using conventional ion-implantation and/or diffusion steps, as shown in FIG. 10C. In one embodiment of this process, dopants can be Mg or Zn. Then, several isolation zones 56 are formed in the substrate 51 for electrically isolating micro LED chips from the transistors, as shown in FIG. 10D. The isolation zones can be dielectric, such as silicon oxide, silicon nitride, aluminum oxide, or aluminum nitride. In this step, formation of the isolation zones includes etching process and re-filling the dielectric layer into etched regions.

In FIG. 10E, n-type MISFETs 90 are formed in and on the p-well 55 by using conventional methods. In one embodiment, the gate dielectric layer 92 and gate 93 are subsequently deposited on the substrate 51 and then etched, and then, the source/drain regions 91 are formed in the p-well 55 by doping, implanting, or diffusing silicon. The gate dielectric layer 92 can be silicon oxide or silicon nitride or other dielectric materials, and the gate 93 can be poly silicon, aluminum or suitable metals. Spacers 94, which can be silicon oxide, are then optionally formed on sidewall of the gate and red micro LED chips 47 for protecting gate and red micro LED chips 47, as shown in FIG. 10F. The formation of the spacers 94 includes depositing a conformal layer on the substrate 51 and etching the conformation layer directly. A transparent ohmic contact layer 18 is then formed on the substrate 51 to electrically contact the red micro LED chips 47 and later transferred blue/green micro LED chips to the transistors 90. The transparent ohmic contact layer 18 can be ITO (Indium Tin Oxide), IZO (Indium Zinc Oxide), IGO (Indium Gallium Oxide), AZO (Aluminum Zinc Oxide), or IGZO (Indium Gallium Zinc Oxide). Then, paired bonding pads 52 are formed on the isolation devices 56 and electrically connect to the transparent ohmic contact layer 18, as shown in FIG. 10G. Then, blue micro LED chip 40 and green micro LED chip 45 are transferred to the paired bonding pads as shown in FIG. 10H.

An ILD layer 64, such as silicon oxide, TEOS (tetra-ethyl-ortho-silicate), epoxy or silicone, is deposited on the substrate 51 by using conventional spin-on coating, as shown in FIG. 10I. Then, contacts 68 are formed in the ILD layer 64 to electrically connect to n-wells 91 of the transistors 90, as shown in FIG. 10J. Formation of the contact 68 includes etching the ILD layer 64 to form a contact hole first and then a metal is filled inside the contact hole. A metal layer 62 is then formed on the ILD layer 64 and electrically connected to the contacts 68 by using conventional methods, as shown in FIG. 10K. The metal layer 62 will provide brightness signal to the micro LED chips 40, 45, and 47 through the transistors 90, and one of the micro LED chip will emits pre-determined brightness of light when corresponding transistors is turned on. A passivation layer 65, such as epoxy, silicone, or MEMS materials, is then formed to cover the transistors 90, micro LED chips, and metal layer 62, as shown in FIG. 10L. A metal layer 66 is optionally formed on backside of the substrate 51, as shown in FIG. 10M, such that all n electrodes of the micro LED chips can be grounded through the metal layer 66. For red micro LED chip 47, the n electrode can be grounded through substrate 51, while for blue/green micro LED chip 40/45, the n electrode can be grounded through via in the substrate 51. The formation of the via may include etching through substrate 51 to form via holes and filling metal inside the via holes by using conventional method.

Figure 11A:
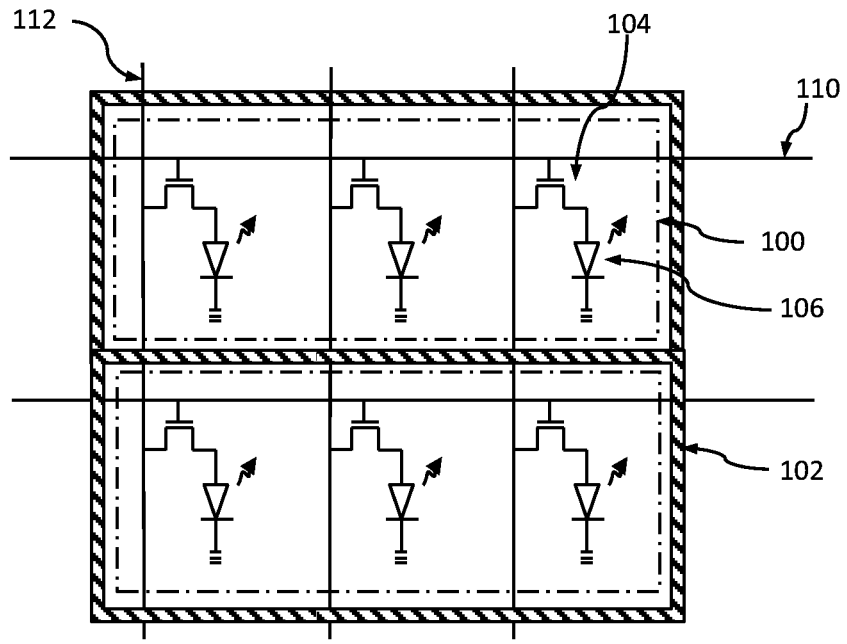
FIGS. 11A and 11B are schematic illustrations of LED display circuits in accordance with two embodiments of the present invention.

In order to understand pixel design of the micro LED display, it would be better to have a top view to illustrate this invention. In FIG. 11A, an active electric circuit diagram of two pixels in micro LED display panel is provided. A pixel 100 includes three micro LED chips 106 and three transistors 104. All gate electrodes of the transistors 104 are connected to control signal 110 and all source electrodes of the transistor 104 are connected to bright signal 112. The control signal 110 will provide signals to which micro LED chip 106 should be turned on/off through the transistor 104. The brightness signal 112 will provide signals to which micro LED chip 106 should have specific brightness. Functions of the transistors 104 are similar to the TFT (thin film transistor) in LCD panel. Black matrix 102 encompassing each pixel 100 may enhance contrast and reduce interference among all pixels 100. The p electrode (anode) of the micro LED chip 106 is connected to the drain electrode of the transistor 104 and the n electrode (cathode) of the micro LED chip is grounded.

Figure 11B:
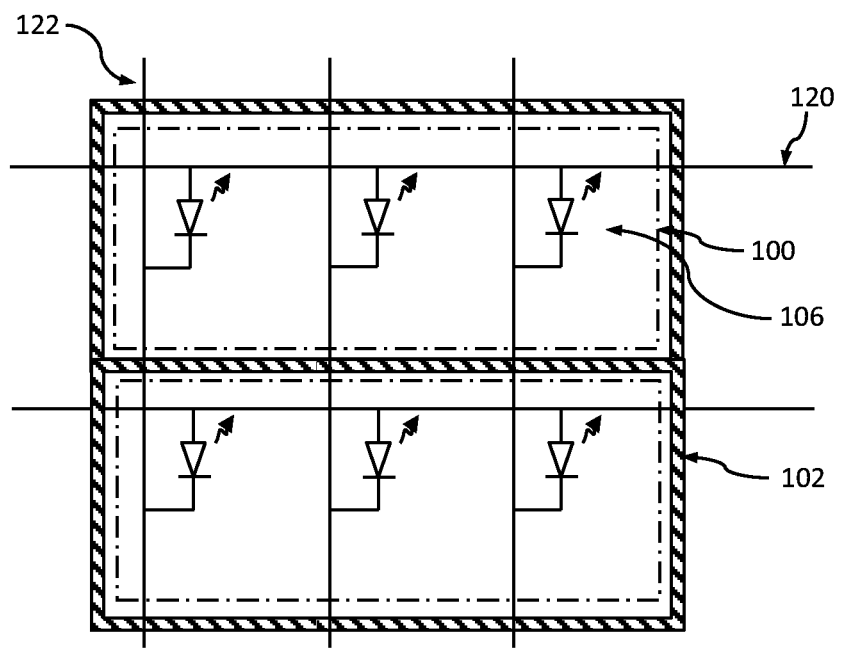

In FIG. 11B, a passive electric circuit diagram of two pixels in micro LED display is provided. In one pixel 100, only three micro LED chips 106 are provided, and all p electrodes (anode) of the micro LED chip 106 connect to image scanning signal 120, and all n electrodes (cathode) of the micro LED chips 106 connect to the switch signal 122. The image scanning signal 120 provides image information to the micro LED chips 106 directly, and the switch signal determines which micro LED chip 106 will be turned on/off. If the switch signal is an open circuit, the connected micro LED chip will be turned off. The switch signal 122 will be open circuit in sequence such that image signal 120 will provide correct signal information to each micro LED chips 106. The micro LED array can be driven by interlace or non-interlaced method to show image and motion. Please notice that in this embodiment, GaAs substrate is not applicable.

Figure 12A:
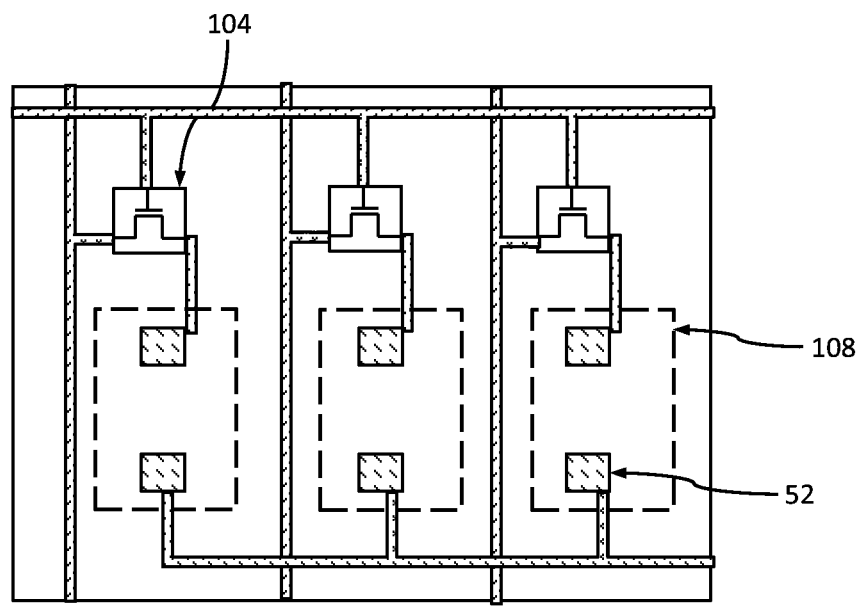
FIGS. 12A and 12B are schematic illustrations of LED display layout in accordance with two embodiments of the present invention.
Figure 12B:
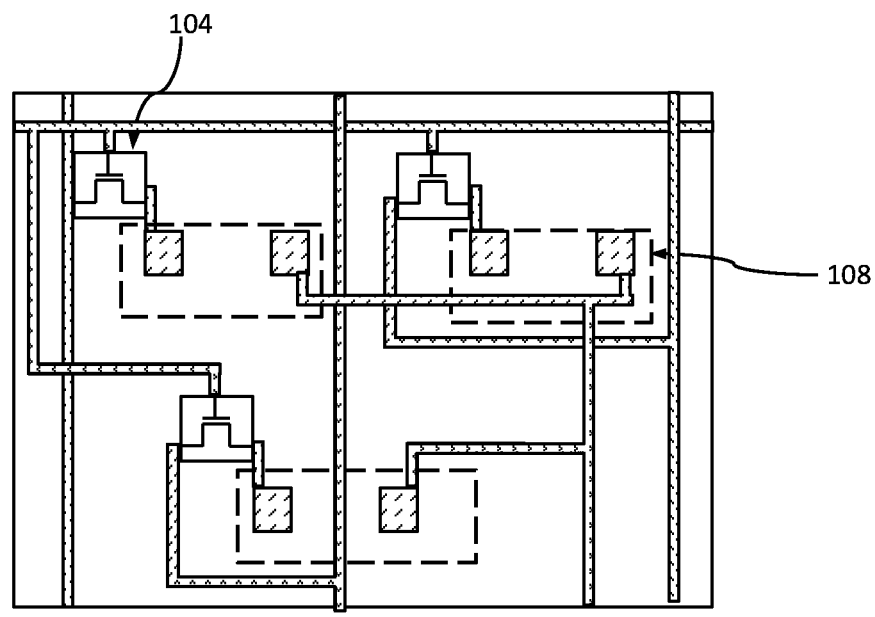

One pixel design layout of the active electric circuit diagram in FIG. 11A on the bonding substrate can be referred to FIGS. 12A and 12B. In FIG. 12A, the RGB layout is sequence and would be easy for manufacturing. The area 108 will receive micro LED chips and the two bonding pads 52 are provided. Zener diode can also be included in the driving circuits as protection circuits. The transistor 104 can be NMIS, PMIS, CMIS transistor, or BJT. In a preferred embodiment, NMIS transistors are used. In this embodiment, common cathode electrode would be optionally. In FIG. 12B, another design layout in one pixel is provided if RGB micro LED chips would like to be designed closely for contrast enhancement.

Figure 13A:
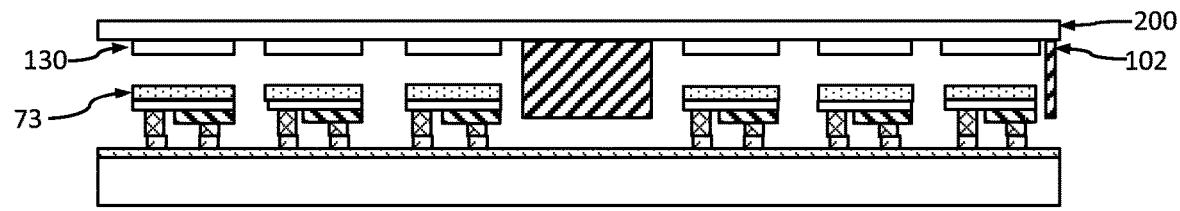
FIG. 13A is a schematic illustration of cross sectional view of LED display by using color filter and phosphor on LED chip in one embodiment of the present invention.
Figure 13B:
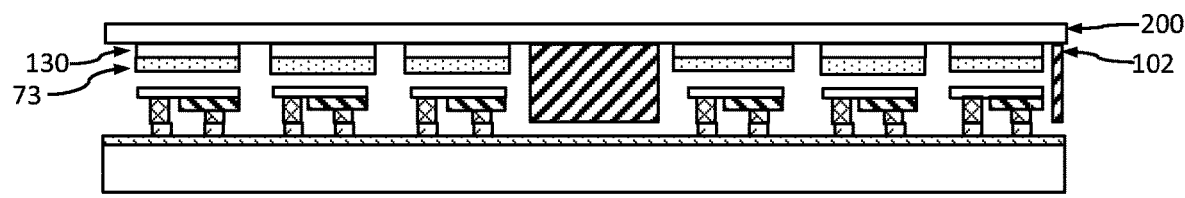
FIG. 13B is another schematic illustration of cross sectional view of LED display by using color filter and phosphor on transparent substrate in one embodiment of the present invention.
Figure 13C:
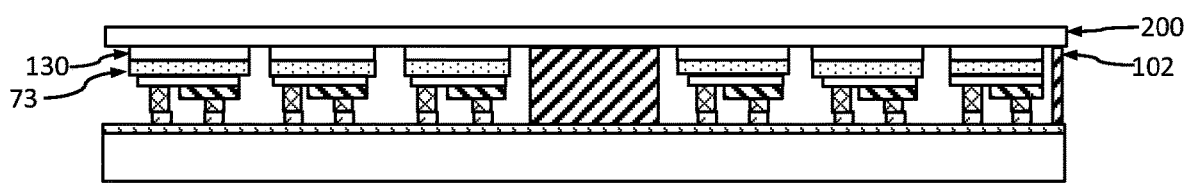
FIG. 13C is another schematic illustration of cross sectional view of LED display by using color filter in one embodiment of the present invention.
Figure 14A:
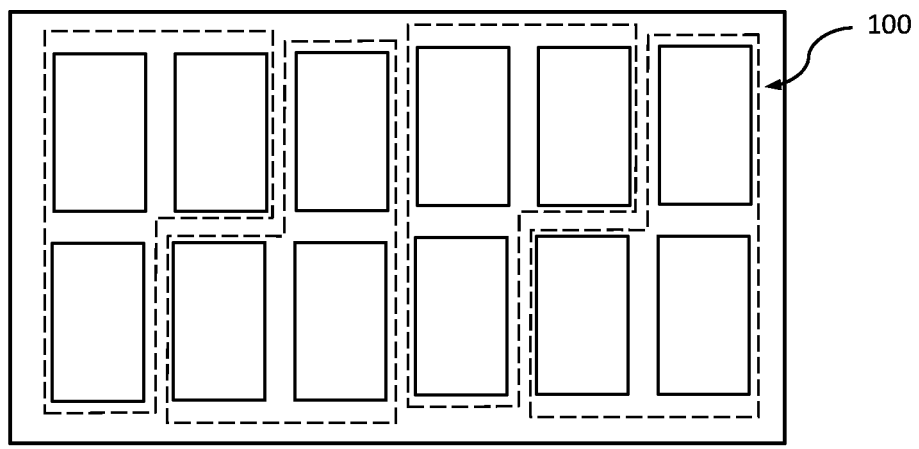
FIG. 14A is a schematic illustration of top view of LED display by using color filter in one embodiment of the present invention.
Figure 14B:
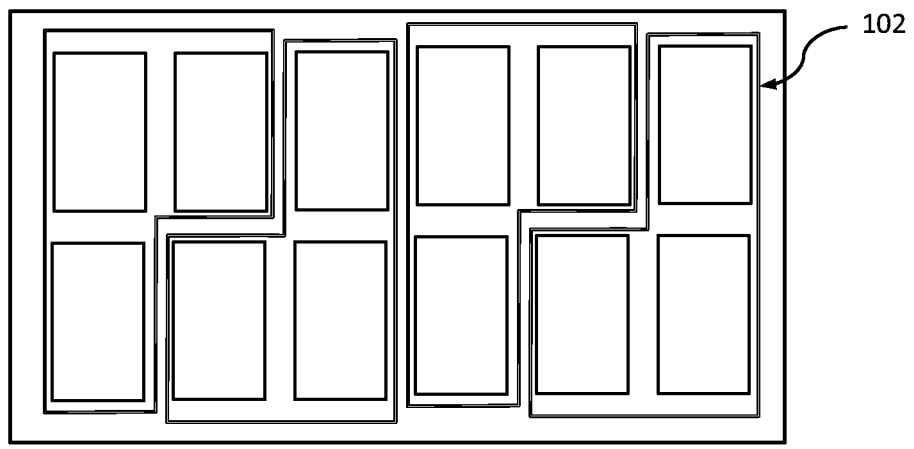
FIG. 14B is a schematic illustration of top view of LED display by using color filter with black matrix in one embodiment of the present invention.

In FIG. 13A, another embodiment of the present invention is provided for micro LED chips. For blue, green, and red LED chips, the driving voltage and life may be different due to the structures and materials of these LEDs. A simple and easy way or method to fabricate micro LED display may include blue micro LED chips only and coated with phosphor 73 thereon. The phosphor 73 emits yellow light and white light can be provided after the yellow light is mixed with the blue light from the micro LED. Then, a transparent substrate 200 is provided with color filter 130 and black matrix 102 thereon. Thus, when each micro LED chip is driven by image signal, after the color filter 130, an image can be shown. The phosphor 73 can generate high color rendering index or color gamut. The substrate 200 with color filter 130 and black matrix is then fit or matched to the LED chip to form a LED display, as shown in FIG. 13C. In another embodiment, phosphor 73 and color filter 130 can be formed on the transparent substrate 200 first, as shown in FIG. 13B. In this embodiment, the substrate 200 with color filter 130, phosphor 73, and black matrix 102 is then fit or matched to the LED chip, also as shown in FIG. 13C. In another embodiment, the phosphor 73 may emit green and red together. In another embodiment, the micro LED chips may emit UV light and the phosphor 73 will emit RGB light. In this embodiment, functions of the color filter 200 will be similar to the color filter in the TFT LCD display panel, but however there is no more liquid crystal layer. For the TFT LCD display panel, even the totally dark image being provided, there is some white light leaked from the LCD panel because the liquid crystal can't completely turn-off back light. However, to the prevent invention LED display panel, the LED can be completely turned off such that dark image can be compared to the conventional CRT monitor or plasma display with excellent quality. In FIG. 14A, it's the top view form the transparent substrate 100 to show four pixels 100. The black matrix 102 can be formed around a pixel, as shown in FIG. 14B.

Figure 15A:
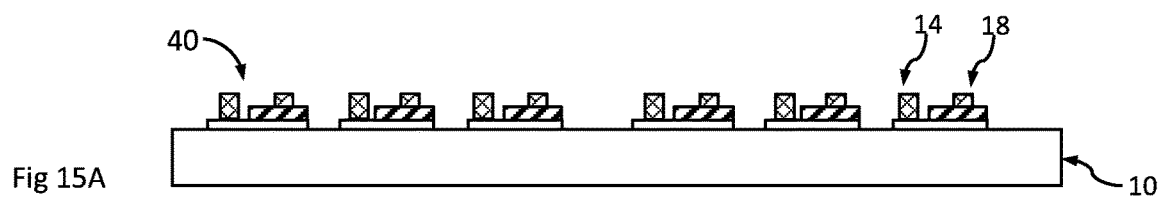
FIGS. 15A~15E are schematic representations of structures at various stages during the formation of a passive GaN LED display on sapphire with coated phosphors and color filter substrate in accordance with another embodiment of the present invention.
Figure 15B:
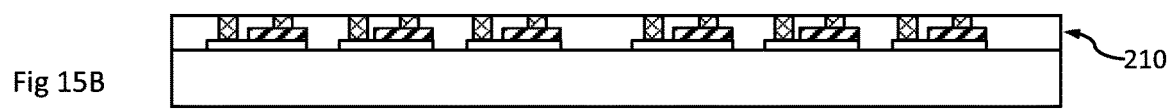
Figure 15C:
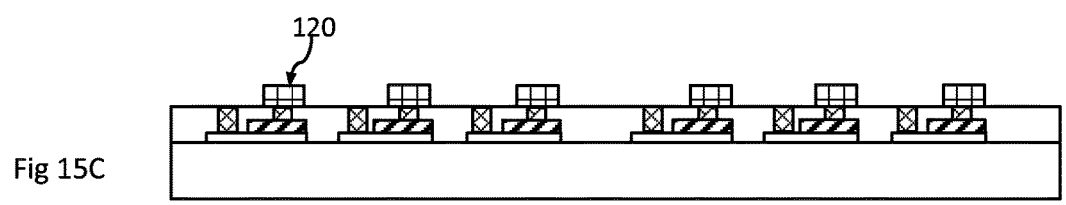
Figure 15D:
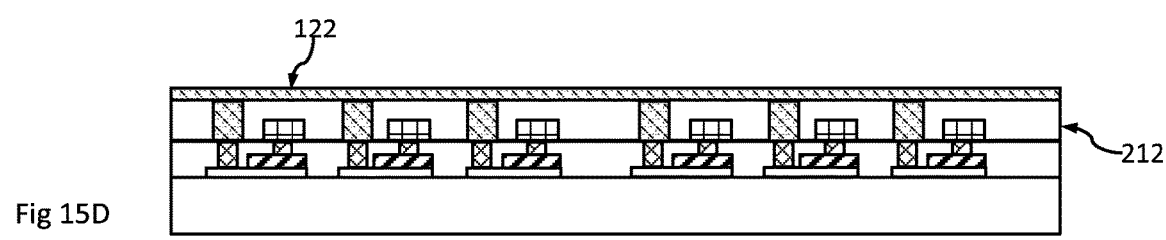
Figure 15E:
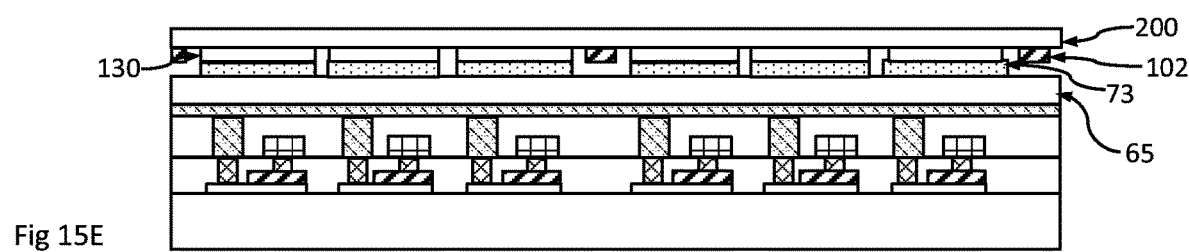

In this invention, another embodiment is provided that all LED chips are not transferred to bonding substrate in a passive mode LED display panel. Please refer to FIG. 15A, wherein LED chips 40 already formed on the sapphire substrate 10 with n/p ohmic contact electrodes 14/18 respectively. In this embodiment, the LED chips 40 emit blue light. The formation of LED chips configuration should be defined in accordance with display pixel, and in this embodiment, the left three LED chips are grouped as one pixel while the right three LED chips are grouped another pixel. Then, a dielectric layer 210 is formed to cover the LED chips 40 and n/p ohmic contact electrodes 14/18 are exposed as shown in FIG. 15B. The dielectric layer 210 can be silicon oxide, silicon nitride, TEOS, epoxy, or silicone. A transparent conductive layer, such as ITO, IGO, IZO, IGZO, or AZO, is formed and patterned as image scanning signal line 120 to individually electrically connect each p ohmic conduct electrode as shown in FIG. 15C. The image scanning signal line 120 can also be referred to FIG. 11B. Then, another dielectric layer 212, such as silicon oxide, silicon nitride, epoxy, or silicone, is formed to cover the LED chips and the image scanning signal line 120. Several holes are formed in the dielectric layer 212 to expose each n ohmic contact electrode 14, and another transparent conductive layer, such as ITO, IGO, IZO, IGZO, or AZO, are filled within every hole and patterned on the dielectric layer 212 as switch signal lines 122, as shown in FIG. 15D. The switch signal line 122 can also be referred to FIG. 11B. A passivation layer 65 is formed to blanket cover the switch signal line 122, and phosphor 73, with high color rendering index, emitting yellow light to combine with the blue GaN LED chip 40 to generate white light. If the LED chip 40 emits UV, RGB mixed phosphors can be applied. A transparent substrate 200 coated with color filter 130 and black matrix 102 is to fit the micro LED chip 40 on the epi-substrate 10, as shown in FIG. 15E. Thus a passive LED displayer with GaN LED chip is formed.

Figure 16:
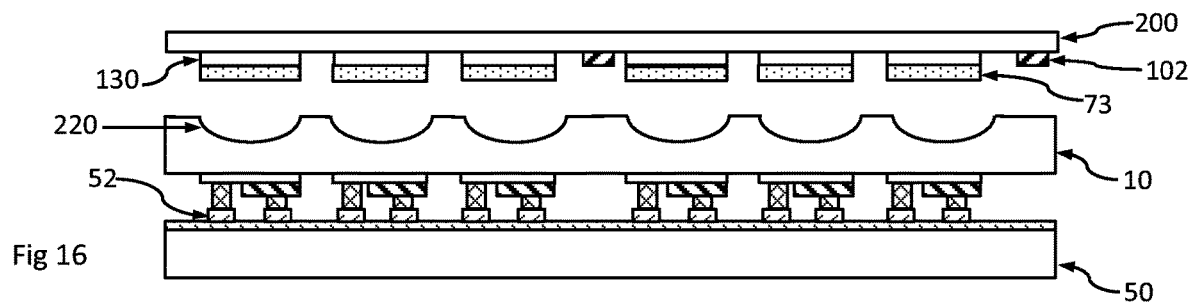
FIG. 16 is a schematic representation of a cross-sectional view of a passive GaN LED display with microlens array in accordance with another embodiment of the present invention.

Another embodiment for passive LED display panel is also provided. Please refer to FIG. 16, wherein the sapphire substrate 10 with LED chips are formed and flipped to bond with bonding substrate 50 with paired bonding pads 52. Similar to previous embodiment, the LED chips configuration should be defined in accordance with display pixel. Then, micro lens array 220 is formed on the back side of the epi-substrate 10 as shown in FIG. 15B. The micro lens may be a single element with one plane surface and one spherical convex surface to refract the light, or have has two flat and parallel surfaces and the focusing action is obtained by a variation of refractive index across the lens which is gradient-index lenses. Formation of micro lens array 220 can be moulding or embossing from a master lens array. Then, a transparent substrate 200 with phosphor 73, color filter 130, and black matrix 102 sequentially formed thereon to fit with each LED chip.

Figure 17:
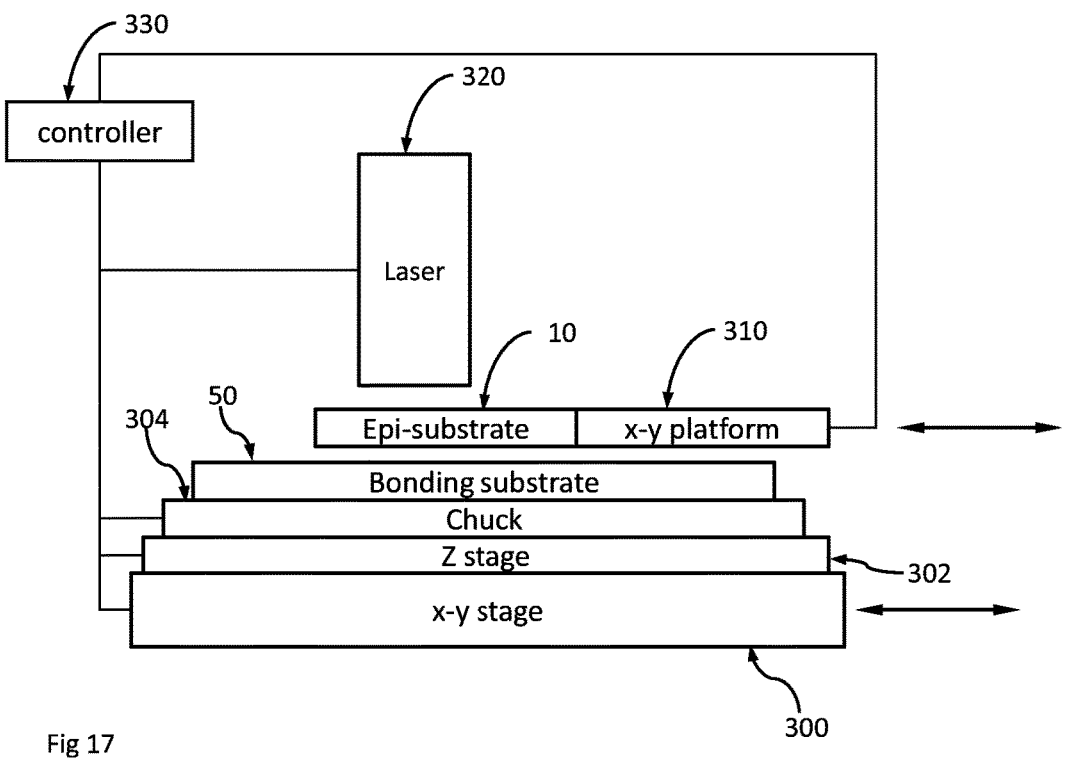
FIG. 17 is a schematic illustration of an apparatus for forming LED chips on the bonding substrate in accordance with one embodiment of the present invention.

In FIG. 17, an apparatus for manufacturing micro LED display is provided. An x-y stage 300 provides two directions orthogonal with each other horizontally. The x-y stage 300 is used to provide bonding substrate moving along x-y directions such that bonding pads to be bonded can be moved to a specific position. A z stage 302 on the x-y stage 300 provides a direction orthogonal to the x-y stage, vertical direction. The purpose of providing z stage 302 is to adjust bonding substrate height such that LASER can be focused to the epi-substrate at a desired position. A chuck 304, such as electrostatic chuck or vacuum chuck, is provided on the z stage 302 for fastening the bonding substrate. Then, bonding substrate 50 is held on the E-chuck 50. An x-y platform 310, which provides similar two directions orthogonal with each other in horizontal direction, will move between the bonding substrate 50 and the LASER 320. The epi-substrate 10 is mounted on the x-y platform 310 such that a desired LED chip can be moved to the specific position such that the LED chip can be illuminated by the LASER 320 and separated from the epi-substrate 10 to the bonding substrate 50. The x-y platform 310 will keep the same pitch to the z-stage. The Excimer LASER 320 is used to illuminate on the epi-substrate such that LED chip or chips can be separated from the epi-substrate 10. A controller 300, electrically connecting to x-y stage 300, z-stage 302, chuck 304, x-y platform 310, and LASER 320.

Figure 18:
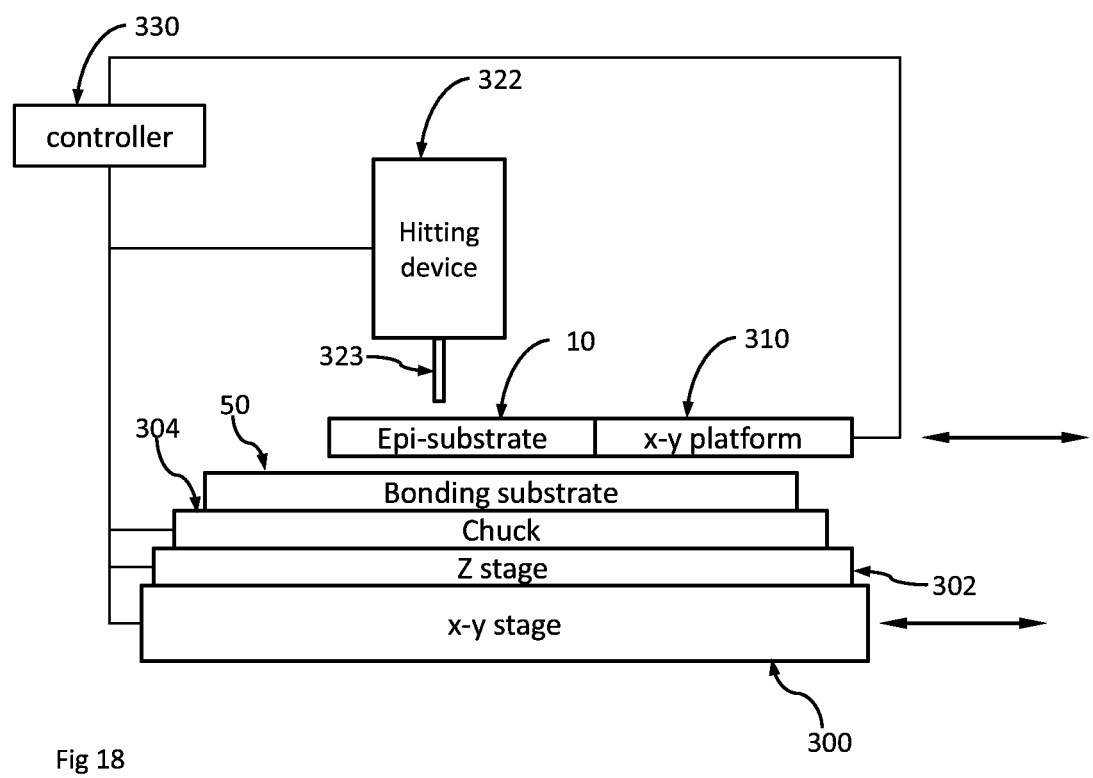
FIG. 18 is a schematic illustration of an apparatus for forming LED chips on the bonding substrate in accordance with another embodiment of the present invention.

In FIG. 18, for the embodiment that an LED transfer apparatus is provided when LASER lift-off is not applicable. A pressing device 322 with a tip 323 replaces the Excimer LASER 320 in FIG. 14. When the micro LED chip on the tape should be transferred to the bonding substrate, the tip will extend or stretch out from the pressing device to hit down the micro LED chip to the bonding substrate.

The present invention provides advantages include that mass transfer micro LED is industrial and commercial available first. All micro LED chips are transferred from epi-substrate to bonding substrate directly, and hence throughput can be enhanced. Further, mass production for micro LED display can be possible. In this invention, the structure and manufacture can be adapted to phosphors. Further, quaternary red LED chips can be formed on bonding substrate directly if the bonding substrate is GaAs. If the color filter and phosphor can be applied to the LED display, only GaN LED chips are configured to the LED display. For some specific configurations, mass transfer is not necessary for passive LED display with signal lines directly formed on the GaN LED chip and sapphire substrate. In the present invention, there is no package process.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for forming a display panel, comprising steps of:
   providing a first substrate with a first plurality of light emitting diode chips epitaxially formed thereon, for each first light emitting diode chip of the first plurality of light emitting diode chips, a paired Ohmic electrodes being formed on the first light emitting diode chip, wherein the each light emitting diode emits light with a first wavelength;
   providing a second substrate with driving circuits thereon for the display panel and a plurality of paired bonding pads;
   flipping the first substrate to align the first plurality of light emitting diode chips close to the plurality of the paired bonding pads;
   separating the first plurality of light emitting diode chips from the first substrate and placing onto the second substrate; and
   reflowing the second substrate such that the first plurality of light emitting diode chips are fastened on the second substrate.

2. The method according to claim 1, wherein the second substrate is GaAs, PCB, silicon, silicon carbide, or ceramic, and the second substrate includes a second plurality of light emitting diode chips, each second light emitting diode chip of the second plurality of light emitting diode chips emitting light with a second wavelength longer than the first wavelength, when the second substrate uses GaAs.

3. The method according to claim 2, wherein the first plurality of light emitting diode chips includes III-arsenide or III-phosphide for emitting red light, or III-nitride when the first substrate is a tape, and the first plurality of light emitting diode chips includes III-nitride for emitting UV, blue or green light when the first substrate is sapphire or SiC.

4. The method according to claim 3, wherein said separating step is operated by using LASER exposure if the first substrate is sapphire or SiC, and said separating step is operated by pressing back side the first substrate without the plurality of light emitting diode chip if the first substrate is the tape.

5. The method according to claim 1, wherein the driving circuit is an active circuit array or a passive circuit array.

6. The method according to claim 1, wherein a first pitch in the first plurality of light emitting diode chips on the first substrate is small than a second pitch in the plurality of paired bonding pads on the second substrate.

7. The method according to claim 6, wherein said flipping step is operated to align the first plurality of light emitting diode chips to the plurality of paired Ohmic electrodes.

8. The method according to claim 7, wherein said separating step is operated to the each first light emitting diode chip on the first substrate.

9. The method according to claim 1, wherein a first pitch in the first plurality of light emitting diode chips on the first substrate is small than a second pitch in the plurality of paired bonding pads on the second substrate.

10. The method according to claim 9, wherein said flipping step is operated to align one of the first plurality of light emitting diode chips to one of the plurality of paired Ohmic electrodes, and then said separating step is operated.

11. The method according to claim 1, wherein a phosphor is formed on the first plurality of light emitting diode chips for providing light with a third wavelength longer than first wavelength light, and lights with the third wavelength and the first wave length provide white light.

12. The method according to claim 11, further comprising a step of providing a third transparent substrate, on the second substrate, with a color filter thereon after said reflowing step.

13. A method for forming a display panel, comprising:
   providing a sapphire substrate with a plurality of GaN light emitting diode chips thereon, wherein each of the plurality of GaN light emitting diode chips has a first electrode and a second electrode;
   providing a bonding substrate with driving circuits and a plurality of paired bonding electrodes thereon;
   transferring the plurality of GaN light emitting diode chips to the plurality of paired bonding electrodes;
   providing a phosphor layer on the plurality of GaN light emitting diode chips respectively; and
   fitting a transparent substrate with a color filter thereon to the bonding substrate such that the color filter will align to the plurality of GaN light emitting diode chips.

14. The method according to claim 13, wherein said transferring step is operated by using LASER exposure.

15. The method according to claim 14, wherein the driving circuits are an active circuit array or a passive circuit array.

16. The method according to claim 15, wherein the phosphor layer provides light with a second wavelength longer than a first wavelength light of the plurality of GaN light emitting diode chips, and lights with the second wavelength and the first wave length provide white light.

17. A method for forming a display panel, comprising:
   providing a sapphire substrate with a plurality of GaN light emitting diode chips thereon, wherein each of the plurality of GaN light emitting diode chips has a first electrode and a second electrode;
   forming a first dielectric layer on the sapphire substrate and the plurality of GaN light emitting diode chips;
   exposing the first electrodes and the second electrodes;
   forming a first transparent conductive layer on the first dielectric layer;
   patterning the first transparent conductive layer to a first plurality of signal lines to electrically connect to a row of the first electrodes of the plurality of GaN light emitting diode chips;
   forming a second dielectric layer on the first dielectric layer and the first patterned transparent conductive layer;
   exposing the second electrodes;
   forming a second transparent conductive layer on the second dielectric layer;
   patterning the second transparent conductive layer to a second plurality of signal lines to electrically connect to a column of the second electrodes of the plurality of GaN light emitting diode chips;
   forming a passivation layer to cover the second patterned transparent conductive layer and the second dielectric layer;
   providing a phosphor layer on the passivation layer; and
   fitting a transparent substrate with a color filter layer thereon to the sapphire substrate such that the color filter layer will align with the plurality of GaN light emitting diode chips.

18. The method according to claim 17, wherein the phosphor layer provides light with a second wavelength longer than a first wavelength light of the plurality of GaN light emitting diode chips, and lights with the second wavelength and the first wave length provide white light.

\* \* \* \* \*